US011943991B2

(12) United States Patent
Lee et al.

(10) Patent No.: US 11,943,991 B2
(45) Date of Patent: Mar. 26, 2024

(54) ELECTRONIC DEVICE

(71) Applicant: Samsung Display Co., Ltd., Yongin-Si (KR)

(72) Inventors: Hyun Jae Lee, Yongin-si (KR); Sanghyun Lim, Yongin-si (KR)

(73) Assignee: Samsung Display Co., Ltd., Yongin-Si (KR)

(*) Notice: Subject to any disclaimer, the term of this patent is extended or adjusted under 35 U.S.C. 154(b) by 0 days.

(21) Appl. No.: 18/110,922

(22) Filed: Feb. 17, 2023

(65) Prior Publication Data
US 2023/0363234 A1 Nov. 9, 2023

(30) Foreign Application Priority Data

May 9, 2022 (KR) .................. 10-2022-0056494

(51) Int. Cl.
H10K 59/40 (2023.01)
G06F 3/044 (2006.01)
H01Q 1/24 (2006.01)
H04M 1/02 (2006.01)

(52) U.S. Cl.
CPC ........... *H10K 59/40* (2023.02); *G06F 3/0446* (2019.05); *H01Q 1/243* (2013.01); *H04M 1/0266* (2013.01); *G06F 2203/04111* (2013.01); *H04M 2250/22* (2013.01)

(58) Field of Classification Search
CPC ...... G06F 3/041–048; G06F 2203/041–04114; G06F 2203/04112; G06F 2203/04107; G06F 3/0446; G06F 3/0445; G06F 3/0443; G06F 2203/04111; G06F 3/0412; H01Q 1/243; H01Q 1/38; H01Q 1/22; H01Q 1/36
See application file for complete search history.

(56) References Cited

U.S. PATENT DOCUMENTS

| 9,652,073 | B2 | 5/2017 | Lim et al. |
| 10,990,234 | B2 | 4/2021 | Kim et al. |
| 11,106,254 | B2 | 8/2021 | Katsuyama et al. |
| 2021/0135340 | A1 | 5/2021 | Kim et al. |
| 2022/0137741 | A1 | 5/2022 | Choi et al. |

FOREIGN PATENT DOCUMENTS

| KR | 10-2009382 B1 | 8/2019 |
| KR | 10-2175750 B1 | 11/2020 |
| KR | 10-2020-0143488 A | 12/2020 |
| KR | 10-2233676 B1 | 3/2021 |
| KR | 10-2021-0052792 A | 5/2021 |

Primary Examiner — Sanjiv D. Patel
(74) Attorney, Agent, or Firm — Innovation Counsel LLP

(57) ABSTRACT

An electronic device may include a display layer which includes light-emitting regions and a non-light-emitting region disposed adjacent to the light-emitting regions, an antenna pattern which includes first antenna conductive lines extending in a first direction, and a sensor layer. The sensor layer may include a first pattern which is at least partially overlapped with the antenna pattern and a second pattern which is not overlapped with the antenna pattern. The first pattern comprises third sensing conductive lines which extend in the second direction and are spaced apart from each other in the first direction. A portion of the first pattern which is overlapped with the antenna pattern may not include conductive lines extending in the first direction. A portion of the antenna pattern which is overlapped with the first pattern may not include conductive lines extending in the second direction.

20 Claims, 17 Drawing Sheets

ELECTRONIC DEVICE

CROSS-REFERENCE TO RELATED APPLICATIONS

This U.S. non-provisional patent application claims priority under 35 U.S.C. § 119 to Korean Patent Application No. 10-2022-0056494, filed on May 9, 2022, in the Korean Intellectual Property Office, the entire contents of which are hereby incorporated by reference.

BACKGROUND

The present disclosure relates to an electronic device including a sensor layer and an antenna layer.

An electronic device may include electronic modules. For example, the electronic device may be a portable or wearable device, and the electronic modules may include an antenna module, a camera module, or a battery module. As a thickness or size of the portable or wearable device decreases, a space, in which the electronic modules are mounted, is gradually decreased. Furthermore, as the demand for multiple-function and high-performance electronic devices increases, the number of the electronic modules provided in the electronic device increases.

SUMMARY

An embodiment of the inventive concept provides an electronic device with improved sensing performance and improved signal emission performance.

According to an embodiment of the inventive concept, an electronic device may include a display layer including an active region which includes light-emitting regions and a non-light-emitting region disposed adjacent to the light-emitting regions, and a peripheral region which is disposed adjacent to the active region, an antenna pattern including first antenna conductive lines which extend in a first direction and are spaced apart from each other in a second direction crossing the first direction, and a sensor layer including a first pattern at least a portion of which is overlapped with the antenna pattern and a second pattern which is not overlapped with the antenna pattern. The second pattern may include first sensing conductive lines each of which extends in the first direction and second sensing conductive lines each of which extends in the second direction to cross the first sensing conductive lines, the first sensing conductive lines and the second sensing conductive lines defining first openings corresponding to the light-emitting regions. The first pattern may include third sensing conductive lines which extend in the second direction and are arranged to be spaced apart from each other in the first direction. A portion of the first pattern may not include a conductive line extended in the first direction, and a portion of the antenna pattern which is overlapped with the first pattern may not include a conductive line extended in the second direction.

In an embodiment, each of the first pattern and the second pattern may be provided in plural. The sensor layer may include a first sensing insulating layer disposed on the display panel, a second sensing insulating layer disposed on the first sensing insulating layer and defined first contact holes, a third sensing insulating layer disposed on the second sensing insulating layer, and at least one conductive pattern disposed between the first and second sensing insulating layers and overlapped with the contact holes. The first patterns and the second patterns may be disposed on the second sensing insulating layer, and one of the first patterns and the second patterns may be connected to the conductive pattern through the contact holes.

In an embodiment, the electronic device may further include an antenna insulating layer which is overlapped with at least three patterns of the first patterns.

In an embodiment, the antenna insulating layer may be disposed on the third sensing insulating layer.

In an embodiment, the antenna insulating layer may be disposed between the second sensing insulating layer and the third sensing insulating layer, and the antenna pattern may be covered with the third sensing insulating layer.

In an embodiment, the first pattern and the antenna pattern may be disposed on the second sensing insulating layer and may be covered with the third sensing insulating layer. The third sensing conductive lines may be disconnected at intersections with the first antenna conductive lines and the second sensing conductive lines when viewed in a plan view. The first pattern may further include first bridge patterns overlapped with the disconnected portions of the sensing conductive lines, and the first bridge patterns connect the third sensing conductive lines which are disconnected through second contact holes defined in the second sensing insulating layer.

In an embodiment, the first pattern and the antenna pattern may be disposed on the second sensing insulating layer and may be covered with the third sensing insulating layer. The first antenna conductive lines may be disconnected at intersections with the third sensing conductive lines, when viewed in a plan view. The antenna pattern may further include second bridge patterns overlapped with the disconnected portions of the antenna conductive lines, and the second bridge patterns connect the first antenna conductive lines which are disconnected through third contact holes defined in the second sensing insulating layer.

In an embodiment, a portion of the first pattern which is not overlapped with the antenna pattern may further include fourth conductive lines which extend in the first direction to cross the third conductive lines and to define second openings corresponding to the light-emitting regions.

In an embodiment, a portion of the antenna pattern which is not overlapped with the first pattern may further include second antenna conductive lines which extend in the second direction to cross the first conductive lines and to define third openings corresponding to the light-emitting regions.

In an embodiment, the electronic device may further include an antenna pad disposed in the peripheral region, and an antenna line connecting the antenna pattern and the antenna pad.

According to an embodiment of the inventive concept, an electronic device may include a display layer including an active region which includes light-emitting regions and a non-light-emitting region disposed adjacent to the light-emitting regions, and a peripheral region which is disposed adjacent to the active region, an antenna pattern including first antenna conductive lines which extend in a first direction and second antenna lines which extend in a second direction crossing the first direction to cross the first antenna conductive lines, the first antenna conductive lines and the second antenna conductive lines defining first openings corresponding to the light-emitting regions, and a sensor layer including a first pattern at least a portion of which is overlapped with the antenna pattern, and a second pattern which is not overlapped with the antenna pattern. Each of the first pattern and the second pattern may include first sensing conductive lines each of which extends in the first direction and second sensing conductive lines each of which extends in the second direction to cross the first sensing conductive lines, the first sensing conductive lines and the second sensing conductive lines defining second openings corresponding to the light-emitting regions. When viewed in a plan view, intersections of the first sensing conductive lines and the second sensing conductive lines of the first pattern may be disposed in the first openings, and intersections of the first antenna lines and the second antenna lines may be disposed the second openings.

In an embodiment, each of the first sensing conductive lines, the second sensing conductive lines, the first antenna conductive lines, and the second antenna conductive lines may be overlapped with the non-light-emitting region.

In an embodiment, each of the first pattern and the second pattern may be provided in plural. The sensor layer may include a first sensing insulating layer disposed on the display panel, a second sensing insulating layer disposed on the first sensing insulating layer including first contact holes, a third sensing insulating layer disposed on the second sensing insulating layer, and at least one conductive pattern disposed between the first sensing insulating layer and the second sensing insulating layer and overlapped with the contact holes. The first patterns and the second patterns may be disposed on the second sensing insulating layer, and one of the first patterns and the second patterns may be connected to the conductive pattern through the contact holes.

In an embodiment, the electronic device may further include an antenna insulating layer which is overlapped with at least three first patterns.

In an embodiment, the antenna insulating layer may be disposed on the third sensing insulating layer.

In an embodiment, the antenna insulating layer may be disposed between the second sensing insulating layer and the third sensing insulating layer, and the antenna pattern may be covered with the third sensing insulating layer.

In an embodiment, the first pattern and the antenna pattern may be disposed on the second sensing insulating layer and may be covered with the third sensing insulating layer. The first sensing conductive lines and the second sensing conductive lines of the first pattern may be disconnected at intersections with the first antenna conductive lines and the second antenna conductive lines when viewed in a plan view. The first pattern may further include first bridge patterns overlapped with the disconnected portions of the first sensing conductive lines and the second sensing conductive lines. The first bridge patterns may connect first sensing conductive lines and the second sensing conductive lines through second contact holes defined in the second sensing insulating layer.

In an embodiment, the first pattern and the antenna pattern may be disposed on the second sensing insulating layer and may be covered with the third sensing insulating layer. The first antenna conductive lines and the second antenna conductive lines may be disconnected at intersections with the first sensing conductive lines and the second sensing conductive lines when viewed in a plan view. The antenna pattern may further include second bridge patterns overlapped with the disconnected portions of the first antenna conductive lines and the second antenna conductive lines. The second bridge patterns may connect the disconnected portions of the first antenna conductive lines and the second antenna conductive lines through third contact holes which are defined in the second sensing insulating layer.

In an embodiment, an area of the second openings in a portion of the first pattern which is overlapped with the antenna pattern may be larger than an area of the second openings in a portion of the first pattern which is not overlapped with the antenna pattern.

In an embodiment, the electronic device may further include an antenna pad disposed in the peripheral region and an antenna line connecting the antenna pattern and the antenna pad.

DETAILED DESCRIPTION

Figure 1:
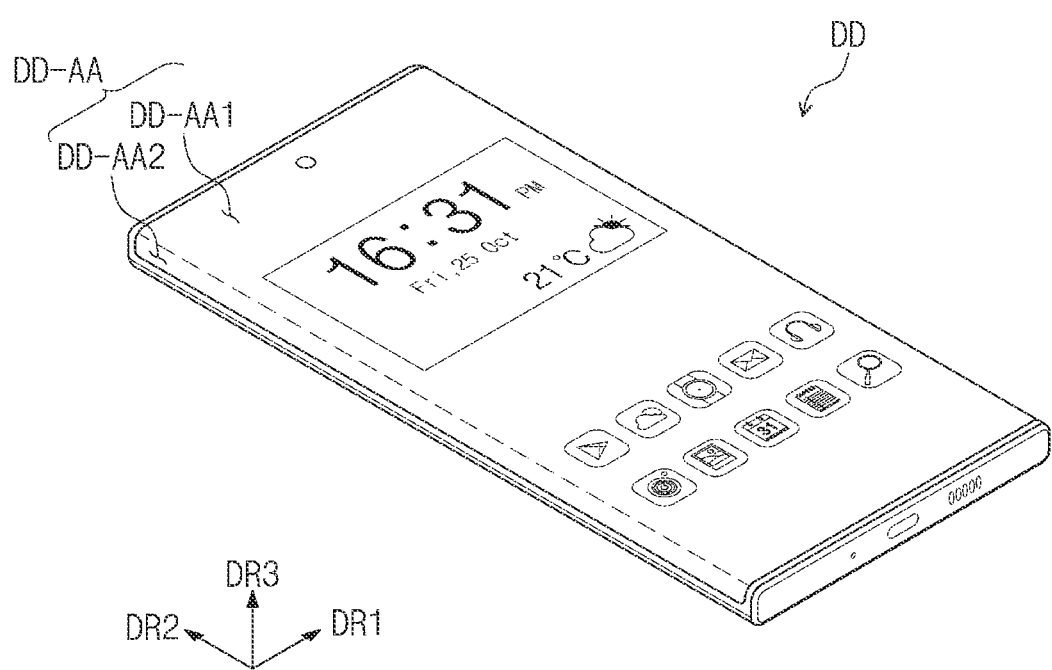
FIG. 1 is a perspective view illustrating an electronic device according to an embodiment of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a perspective view illustrating an electronic device according to an embodiment of the inventive concept.

Referring to FIG. 1, an electronic device DD may be a device that is activated by an electrical signal applied thereto. For example, the electronic device DD may be a cellular phone, a tablet, a navigation system, a gaming machine, or a wearable device but is not limited to these examples. FIG. 1 illustrates an example in which the electronic device DD is a cellular phone.

The electronic device DD may include an active region DD-AA which is used to display an image. The active region DD-AA may include a first display surface DD-AA1, which is parallel to a surface defined by two different directions (e.g., a first direction DR1 and a second direction DR2), and a second display surface DD-AA2.

The second display surface DD-AA2 may extend from a side edge of the first display surface DD-AA1 to have a curved surface. Here, the second display surface DD-AA2 may be bent from the first display surface DD-AA1 with a specific curvature. In an embodiment, a plurality of second display surfaces DD-AA2 may be provided. In this case, the second display surfaces DD-AA2 may extend from at least two side edges of the first display surface DD-AA1. The active region DD-AA may include one first display surface DD-AA1 and one to four second display surfaces DD-AA2. However, the shape of the active region DD-AA is not limited to this example, and only the first display surface DD-AA1 may be defined in the active region DD-AA.

A thickness direction of the electronic device DD may be parallel to a third direction DR3, which is not parallel to the first and second directions DR1 and DR2. A front or top surface and a rear or bottom surface of each member constituting the electronic device DD may be defined based on the third direction DR3. In the present specification, the expression "when viewed in a plan view" and/or "in a plan view" in the present specification will be used to describe a structure viewed in the third direction DR3.

Figure 2:
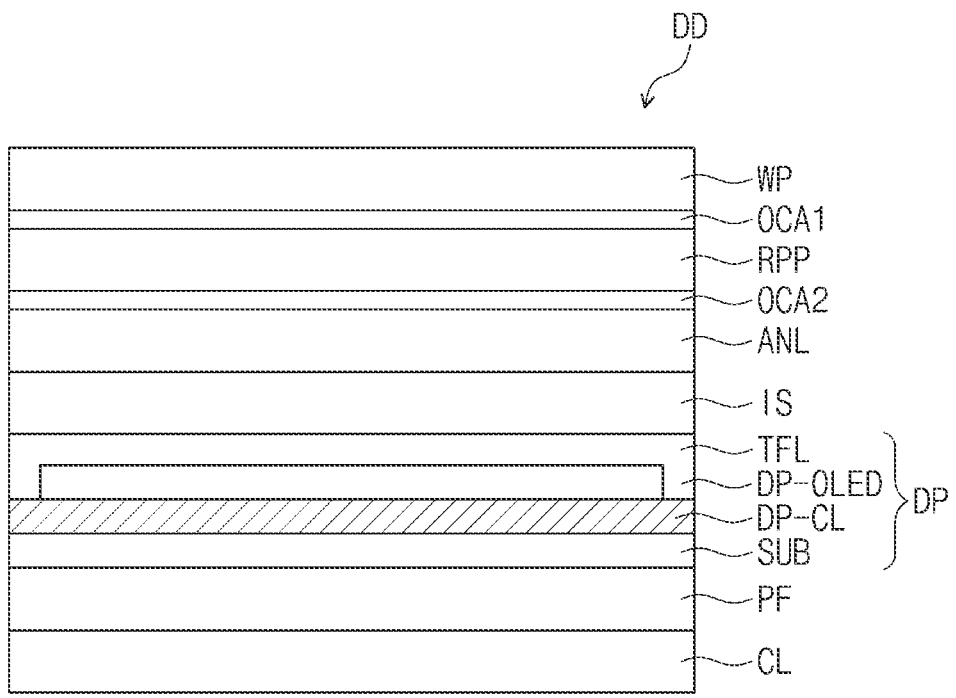
FIG. 2 is a sectional view illustrating a display device according to an embodiment of the inventive concept.
Figure 2:
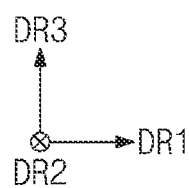

FIG. 2 is a sectional view schematically illustrating an electronic device according to an embodiment of the inventive concept.

Referring to FIG. 2, the electronic device DD may include a window WP, adhesive layers OCA1 and OCA2, an anti-reflection layer RPP, an antenna layer ANL, a sensor layer IS, a display layer DP, a protection layer PF, and a cover layer CL.

The window WP may be combined with a case (not shown) to define an outer appearance of the electronic device DD. The window WP may protect internal components of the electronic device DD from an external impact and may be an element substantially providing the active region DD-AA of the electronic device DD. For example, the window WP may include a glass substrate, a sapphire substrate, or a plastic film. The window WP may have a multi- or single-layered structure. For example, the window WP may have a multi-layered structure including a plurality of plastic films which are coupled to each other by an adhesive layer, or may have a multi-layered structure including a glass substrate and a plastic film which are coupled to each other by an adhesive layer.

A first adhesive layer OCA1 may be disposed below the window WP. The window WP and the anti-reflection layer RPP may be combined to each other by the first adhesive layer OCA1. The first adhesive layer OCA1 may be formed of or include at least one of typical adhesive or gluing agents. For example, the first adhesive layer OCA1 may be, for example, an optically clear adhesive (OCA) film, an optically clear resin (OCR), or a pressure sensitive adhesive (PSA) film.

The anti-reflection layer RPP may be disposed below the window WP. The anti-reflection layer RPP may be configured to decrease reflectance of a natural or solar light which is incident through the window WP. In an embodiment, the anti-reflection layer RPP may include a phase retarder and a polarizer. The phase retarder may be a film type phase retarder or a liquid crystal coating type phase retarder. The polarizer may be a film type polarizer or of a liquid crystal coating type polarizer. The film type polarizer may include a stretched synthetic resin film, and the liquid crystal coating type polarizer may include liquid crystals arranged with a specific orientation. The phase retarder and the polarizer may further include a protection film. The phase retarder itself, the polarizer itself, or the protection film may be defined as a base layer of the anti-reflection layer RPP.

A second adhesive layer OCA2 may be disposed below the anti-reflection layer RPP. The anti-reflection layer RPP and the antenna layer ANL may be combined to each other by the second adhesive layer OCA2. The second adhesive layer OCA2 may be formed of or include the same material as the first adhesive layer OCA1.

The antenna layer ANL may be configured to transmit, receive, or transmit/receive wireless communication signals (e.g., radio frequency signals). The antenna layer ANL may include a plurality of antenna patterns, a plurality of antenna lines, and a plurality of antenna pads. The antenna pads may transmit, receive, or transmit/receive signals within the same frequency band or signals within different frequency bands. The antenna patterns, the antenna lines, and the antenna pads will be described below.

The antenna layer ANL may be disposed on the sensor layer IS. FIG. 2 illustrates an example in which the antenna layer ANL is disposed on the entire top surface of the sensor layer IS, but in an embodiment, the antenna layer ANL may be locally disposed on a partial region of the sensor layer IS.

In an embodiment, the antenna layer ANL may further include antenna insulating layers which are disposed on the sensor layer IS, and antenna patterns which are disposed on corresponding ones of the antenna insulating layers. In an embodiment, the antenna insulating layers may be disposed in the sensor layer IS. However, the inventive concept is not limited to this example, and in an embodiment, the antenna layer ANL may be provided as an additional substrate including antenna patterns and antenna insulating layers, and the additional substrate may be combined to the sensor layer IS by a lamination process or the like.

The sensor layer IS may be configured to obtain information on coordinates of an external input. In an embodiment, the sensor layer IS may be directly disposed on a surface of the display layer DP. For example, the sensor layer IS may be directly integrated on the display layer DP. The sensor layer IS and the display layer DP may be fabricated by processes that are successively performed. However, the inventive concept is not limited to this example, and the sensor layer IS may be fabricated by a separate process and then may be attached to the display layer DP. The sensor layer IS may include a touch panel.

The display layer DP may be disposed below the sensor layer IS. The display layer DP may include a base layer SUB, a circuit device layer DP-CL, a display device layer DP-OLED, and a thin encapsulation layer TFL. The display layer DP may be an element, which is configured to substantially produce an image. The display layer DP may be a light-emitting type display layer, but the inventive concept is not limited to this example. For example, the display layer DP may be an organic light emitting display layer, a quantum dot display layer, a micro-LED display layer, or a nano-LED display layer.

The protection layer PF may be disposed below the display layer DP. The protection layer PF may protect a bottom surface of the display layer DP. The protection layer PF may be formed of or include polyethylene terephthalate (PET). However, the material of the protection layer PF is not limited to PET.

The cover layer CL may be disposed below the protection layer PF. The cover layer CL may have a conductive property. For example, the cover layer CL may be formed of or include copper (Cu). For example, the cover layer CL may be a copper tape. However, the inventive concept is not limited to this example. A ground voltage may be applied to the cover layer CL. However, the inventive concept is not limited to this example, and the cover layer CL may be in a floating state.

Figure 3:
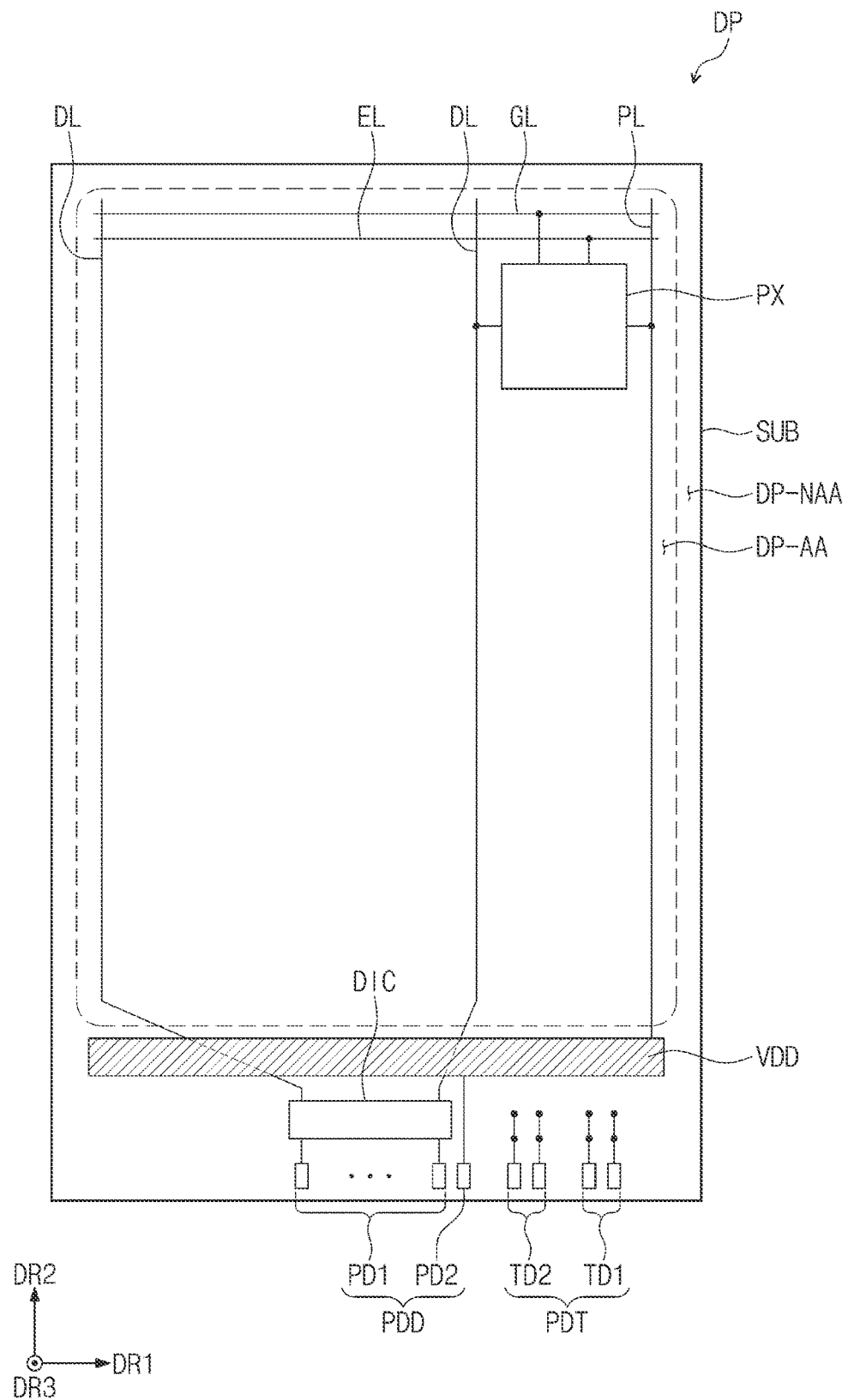
FIG. 3 is a plan view illustrating a display layer according to an embodiment of the inventive concept.

FIG. 3 is a plan view illustrating a display layer according to an embodiment of the inventive concept.

Referring to FIG. 3, the display layer DP may include an active region DP-AA and a peripheral region DP-NAA which is disposed adjacent to the active region DP-AA. The active region DP-AA may be a region on which an image is displayed. A plurality of pixels PX may be disposed in the active region DP-AA. The peripheral region DP-NAA may be a region in which a driving circuit or driving lines connected to the pixels PX are disposed. When viewed in a plan view, the active region DP-AA may be overlapped with the active region DD-AA of the electronic device DD (e.g., see FIG. 1), and the peripheral region DP-NAA may be disposed to surround at least a portion of the active region DP-AA.

The display layer DP may include the base layer SUB, the pixels PX, a plurality of signal lines, a plurality of display pads PDD, and a plurality of sensing pads PDT.

Each of the pixels PX may be configured to display one of primary colors or one of mixed colors. The primary colors may include red, green, and blue. The mixed colors may include various colors, such as white, yellow, cyan, and magenta. However, the color displayed by each of the pixels PX is not limited to one of these examples.

The signal lines may be disposed on the base layer SUB. The signal lines may be connected to the pixels PX and may be used to deliver electrical signals to the pixels PX. The signal lines may include the scan lines GL, the data lines DL, the power lines PL, and the emission control lines EL. However, the inventive concept is not limited to this example, and in an embodiment, the structure of the signal lines may be variously changed. For example, the signal lines may further include an initializing voltage line.

A power pattern VDD may be disposed in the peripheral region DP-NAA. The power pattern VDD may be coupled to the power lines PL. Since the display layer DP includes the power pattern VDD, the same power signal may be provided to the pixels PX.

The display pads PDD may be disposed in the peripheral region DP-NAA. The display pads PDD may include a first pad PD1 and a second pad PD2. In an embodiment, a plurality of first pads PD1 may be provided. The first pads PD1 may be connected to the data lines DL, respectively. The second pad PD2 may be electrically connected to the power lines PL through the power pattern VDD. The display layer DP may provide external electrical signals which are provided through the display pads PDD to the pixels PX. In an embodiment, in addition to the first and second pads PD1 and PD2, the display pads PDD may further include additional pads which are used to receive other electrical signals and the inventive concept is not limited to this example or a specific embodiment.

A driving circuit DIC may be mounted on the peripheral region DP-NAA. The driving circuit DIC may be a timing control circuit which is provided in the form of a chip. The data lines DL may be electrically connected to the first pads PD1, respectively through the driving circuit DIC. However, the inventive concept is not limited to this example, and in an embodiment, the driving circuit DIC may be mounted on an additional film other than the display layer DP. In this case, the driving circuit DIC may be electrically connected to the display pads PDD through the additional film.

The sensing pads PDT may be disposed in the peripheral region DP-NAA. The sensing pads PDT may be electrically connected to a plurality of sensing electrodes which are provided in the sensor layer IS (e.g., see FIG. 2) which will be described below. The sensing pads PDT may include a plurality of first sensing pads TD1 and a plurality of second sensing pads TD2.

Figure 4:
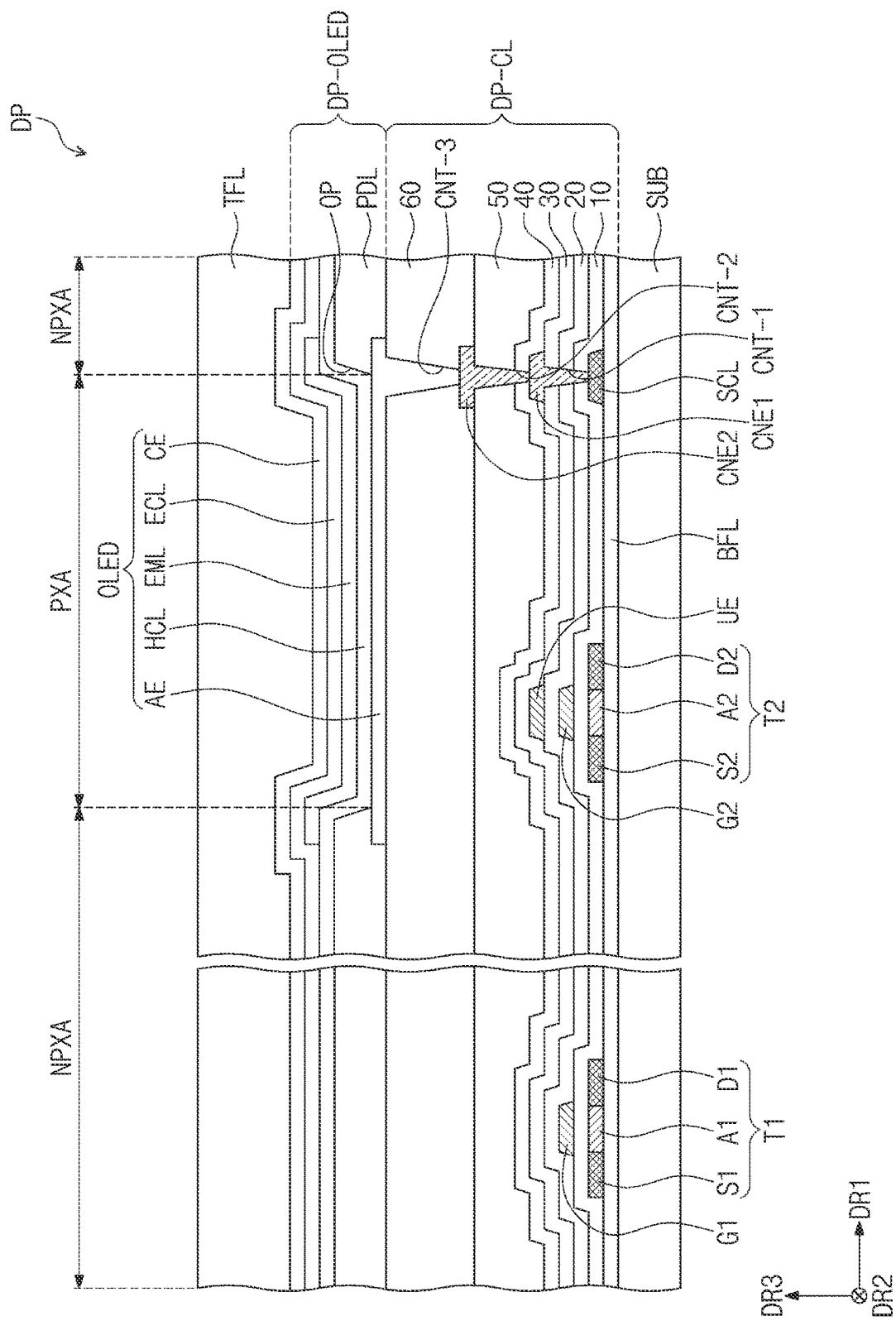
FIG. 4 is a sectional view illustrating a display layer according to an embodiment of the inventive concept.

FIG. 4 is a sectional view illustrating a display layer according to an embodiment of the inventive concept.

Referring to FIG. 4, the display layer DP may include the base layer SUB, the circuit device layer DP-CL, the display device layer DP-OLED, and the thin encapsulation layer TFL. The display layer DP may include a plurality of insulating layers, a plurality of semiconductor patterns, a plurality of conductive patterns, and a plurality of signal lines. An insulating layer, a semiconductor layer, and a conductive layer may be formed by a coating or deposition process. Thereafter, the insulating layer, the semiconductor layer, and the conductive layer may be selectively patterned using a photolithography process. This method may be used to form the semiconductor patterns, the conductive patterns, and the signal lines which are included in the circuit device layer DP-CL and the display device layer DP-OLED. The base layer SUB may be a base substrate supporting the circuit device layer DP-CL and the display device layer DP-OLED.

The base layer SUB may include a synthetic resin layer. The synthetic resin layer may include a thermosetting resin. The base layer SUB may have a multi-layered structure. For example, the base layer SUB may include a first synthetic resin layer, a silicon oxide (SiOx) layer disposed on the first synthetic resin layer, an amorphous silicon (a-Si) layer disposed on the silicon oxide layer, and a second synthetic resin layer disposed on the amorphous silicon layer.

Each of the first and second synthetic resin layers may be formed of or include at least one of polyimide-based resins. In addition, each of the first and second synthetic resin layers may include at least one of acrylate-based resins, methacrylate-based resins, polyisoprene-based resins, vinyl-based resins, epoxy-based resins, urethane-based resins, cellulose-based resins, siloxane-based resins, polyamide-based resins, or perylene-based resins. In an embodiment, the base layer SUB may include a glass substrate or a substrate formed of an organic/inorganic composite material.

At least one inorganic layer may be disposed on a top surface of the base layer SUB. The inorganic layer may be formed of or include at least one of aluminum oxide, titanium oxide, silicon oxide, silicon oxynitride, zirconium oxide, or hafnium oxide. The inorganic layer may have a multi-layered structure including a plurality of inorganic layers. The multi-layered structure of the inorganic layers may include a barrier layer and/or a buffer layer. In the present embodiment, the display layer DP is illustrated to include a buffer layer BFL.

The circuit device layer DP-CL may be disposed on the base layer SUB. The circuit device layer DP-CL may provide signals which are used to drive a light-emitting device OLED in the display device layer DP-OLED to the display device layer DP-OLED. The circuit device layer DP-CL may include the buffer layer BFL, a first transistor T1, a second transistor T2, a first insulating layer 10, a second insulating layer 20, a third insulating layer 30, a fourth insulating layer 40, a fifth insulating layer 50, and a sixth insulating layer 60.

The buffer layer BFL may increase a bonding strength between the base layer SUB and the semiconductor pattern. The buffer layer BFL may include a silicon oxide layer and a silicon nitride layer. In an embodiment, the buffer layer BFL may include silicon oxide layers and silicon nitride layers which are alternately stacked.

The semiconductor pattern may be disposed on the buffer layer BFL. The semiconductor pattern may be formed of or include polysilicon. However, the inventive concept is not limited to this example and the semiconductor pattern may be formed of or include amorphous silicon or metal oxide.

Although a portion of the semiconductor pattern is illustrated in FIG. 4, the semiconductor pattern may further include another portion disposed on another region of the pixel PX (e.g., see FIG. 3), when viewed in a plan view. In an embodiment, the semiconductor patterns may be arranged in accordance with a certain rule throughout the pixels PX. Electrical characteristics of the semiconductor pattern may vary depending on its doping state. The semiconductor pattern may include a first region with high conductivity and a second region with low conductivity. The first region may be doped with n-type or p-type dopants. A p-type transistor may include an impurity region doped with p-type dopants and an n-type transistor may include an impurity region doped with n-type dopants. In an embodiment, the second region may be a non-doped region or may have a doping concentration lower than that of the first region.

The first region may have higher conductivity than that of the second region and may be substantially used as an electrode or a signal line. The second region may substantially correspond to an active or channel region of a transistor. In other words, the semiconductor pattern may include portions which are used as the active region of the transistor, a source or drain region of the transistor, and a connection electrode or connection signal line, respectively.

The pixel PX may include a pixel circuit having seven transistors and a single capacitor, and a light-emitting device connected to the pixel circuit, but the configuration of the pixel may be variously changed. Two transistors T1 and T2 and the light-emitting device OLED which are included in the pixel PX are exemplarily illustrated in FIG. 4. The first transistor T1 may include a source S1, an active A1, a drain D1, and a gate G1. The second transistor T2 may include a source S2, an active A2, a drain D2, a gate G2, and an upper electrode UE.

The source S1, the active A1, and the drain D1 of the first transistor T1 may be formed of the semiconductor pattern, and the source S2, the active A2, and the drain D2 of the second transistor T2 may be formed of the semiconductor pattern. When viewed in a sectional view, the source S1 or S2 and the drain D1 or D2 may extend from the active A1 or A2 in opposite directions, respectively. FIG. 4 illustrates a portion of a connection signal line SCL formed of the semiconductor pattern. Although not shown in the drawings, the connection signal line SCL may be electrically connected to the drain D2 of the second transistor T2 when viewed in a plan view.

The first insulating layer 10 may be disposed on the buffer layer BFL. The first insulating layer 10 may be cover the semiconductor pattern. The first insulating layer 10 may be an inorganic layer and/or an organic layer and may have a single- or multi-layered structure. The first insulating layer 10 may be formed of or include at least one of aluminum oxide, titanium oxide, silicon oxide, silicon oxynitride, zirconium oxide, or hafnium oxide. In the present embodiment, the first insulating layer 10 may be a single silicon oxide layer. Not only the first insulating layer 10 but also an insulating layer of the circuit device layer DP-CL to be described below may be an inorganic layer and/or an organic layer and may have a single- or multi-layered structure. The inorganic layer may be formed of or include at least one of the materials described above.

The gates G1 and G2 may be disposed on the first insulating layer 10. The gate G1 or G2 may be portions of a metal pattern. The gates G1 and G2 may be overlapped with the actives A1 and A2. The gates G1 and G2 may be used as a mask in a process of doping the semiconductor pattern.

The second insulating layer 20 may be disposed on the first insulating layer 10. The second insulating layer 20 may cover the gates G1 and G2. The second insulating layer 20 may be overlapped in common with the pixels PX. The second insulating layer 20 may be an inorganic layer and/or an organic layer and may have a single- or multi-layered structure. In the present embodiment, the second insulating layer 20 may be a single silicon oxide layer.

The upper electrode UE may be disposed on the second insulating layer 20. The upper electrode UE may be overlapped with the gate G2. The upper electrode UE may be a portion of a metal pattern. A portion of the gate G2 and the upper electrode UE may constitute a capacitor. However, the inventive concept is not limited to this example, and in an embodiment, the upper electrode UE may be omitted.

The third insulating layer 30 may be disposed on the second insulating layer 20. The third insulating layer 30 may cover the upper electrode UE. In the present embodiment, the third insulating layer 30 may be a single silicon oxide layer. A first connection electrode CNE1 may be disposed on the third insulating layer 30. The first connection electrode CNE1 may be coupled to the connection signal line SCL through a contact hole CNT-1 which is formed through the first to third insulating layer 10, 20, and 30.

The fourth insulating layer 40 may be disposed on the third insulating layer 30. The fourth insulating layer 40 may cover the first connection electrode CNE1. The fourth insulating layer 40 may be a single silicon oxide layer.

The fifth insulating layer 50 may be disposed on the fourth insulating layer 40. The fifth insulating layer 50 may be an organic layer. A second connection electrode CNE2 may be disposed on the fifth insulating layer 50. The second connection electrode CNE2 may be coupled to the first connection electrode CNE1 through a contact hole CNT-2 which is formed through the fourth insulating layer 40 and the fifth insulating layer 50.

The sixth insulating layer 60 may be disposed on the fifth insulating layer 50. The sixth insulating layer 60 may cover the second connection electrode CNE2. The sixth insulating layer 60 may be an organic layer.

The display device layer DP-OLED may include a pixel definition layer PDL and the light-emitting device OLED. The light-emitting device OLED may include a first electrode AE, a hole control layer HCL, an emission layer EML, an electron control layer ECL, and a second electrode CE.

The first electrode AE may be disposed on the sixth insulating layer 60. The first electrode AE may be connected to the second connection electrode CNE2 through a contact hole CNT-3, which is formed through the sixth insulating layer 60.

A display opening OP may be defined in the pixel definition layer PDL. At least a portion of the first electrode AE may be exposed to the outside of the pixel definition layer PDL through the display opening OP.

The display layer DP may include a light-emitting region PXA and a non-light-emitting region NPXA disposed adjacent to the light-emitting region PXA. The non-light-emitting region NPXA may be provided to surround the light-emitting region PXA. In the present embodiment, the light-emitting region PXA may be defined to correspond to a region of the first electrode AE exposed through the display opening OP. The light-emitting region PXA and the non-light-emitting region NPXA may be included in the active region DP-AA described with reference to FIG. 3.

The hole control layer HCL may be disposed in common in the light-emitting region PXA and the non-light-emitting region NPXA. The hole control layer HCL may include a hole transport layer and, in an embodiment, the hole control layer HCL may further include a hole injection layer. The emission layer EML may be disposed on the hole control layer HCL. The emission layer EML may be disposed in a region corresponding to the display opening OP. For example, the emission layer EML may be formed to include a plurality of portions which are respectively disposed in the pixels.

The electron control layer ECL may be disposed on the emission layer EML. The electron control layer ECL may include an electron transport layer, and in an embodiment, the electron control layer ECL may further include an electron injection layer. The hole control layer HCL and the electron control layer ECL may be formed in common in the pixels PX using an open mask. The second electrode CE may be disposed on the electron control layer ECL. The second electrode CE may be provided in the form of a single object. The second electrode CE may be disposed in common in the pixels PX.

The thin encapsulation layer TFL may be disposed on the display device layer DP-OLED to cover the display device layer DP-OLED. The thin encapsulation layer TFL may include a first inorganic layer, an organic layer, and a second inorganic layer which are sequentially stacked in the third direction DR3. However, the structure of the thin encapsulation layer TFL is not limited to this example. For example, in an embodiment, the thin encapsulation layer TFL may further include a plurality of inorganic layers and a plurality of organic layers.

The first inorganic layer may prevent external moisture or oxygen from being permeated into the display device layer DP-OLED. In an embodiment, the first inorganic layer may be formed of or include at least one of silicon nitride, silicon oxide, or compounds thereof.

The organic layer may be disposed on the first inorganic layer and may have a flat top surface. Even when the first inorganic layer is formed to have an uneven top surface or particles are formed on the first inorganic layer, the uneven top surface of the first inorganic layer or the particles may be covered by the organic layer to have a planarized surface.

The organic layer may be formed of or include at least one of acryl-based organic materials, but the inventive concept is not limited thereto.

The second inorganic layer may be disposed on the organic layer to cover the organic layer. The second inorganic layer may encapsulate the organic layer and may prevent moisture in the organic layer from being leaked to the outside. The second inorganic layer may be formed of or include at least one of, for example, silicon nitride, silicon oxide, or compounds thereof.

Figure 5A:
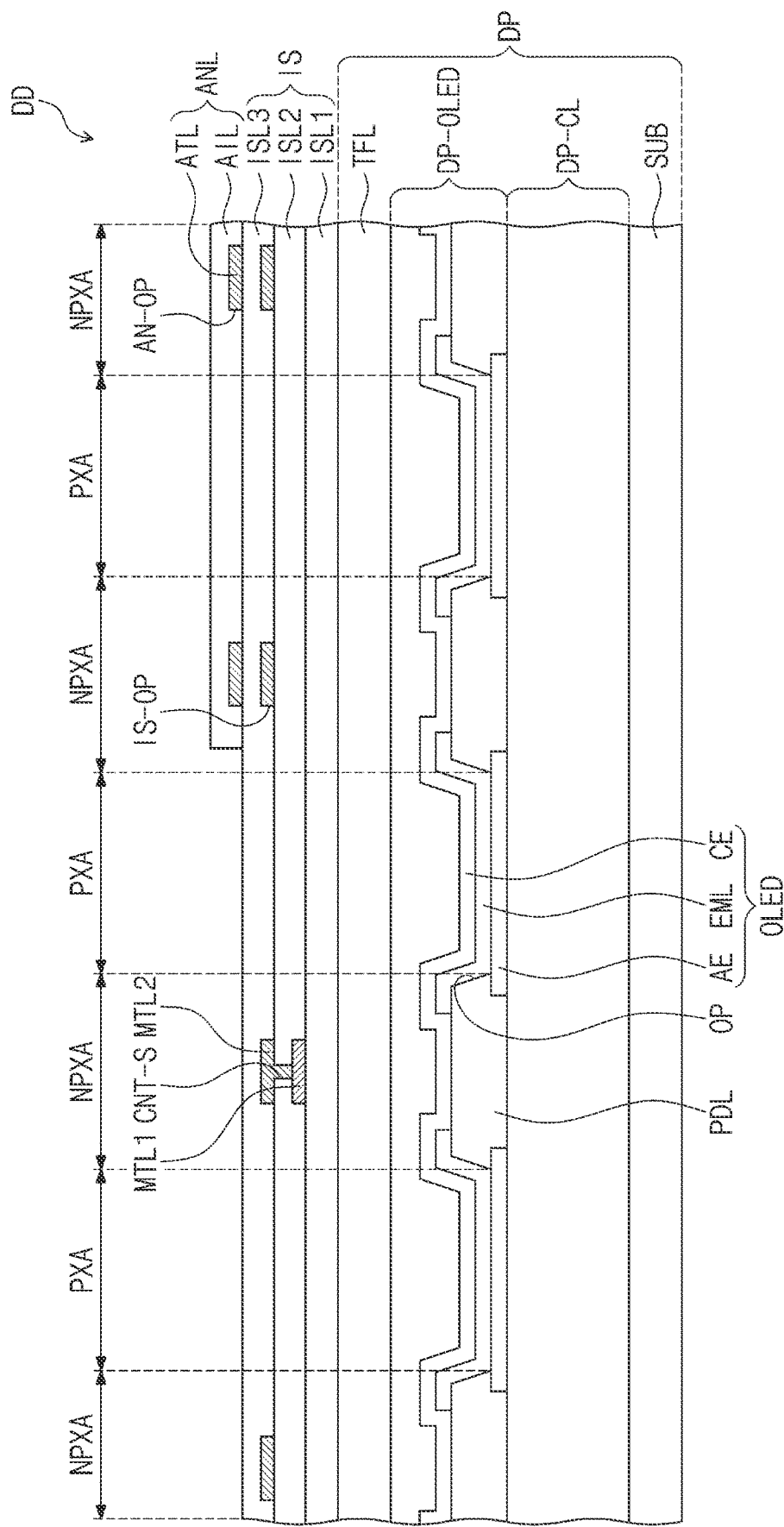
FIG. 5A is a sectional view illustrating an electronic device according to an embodiment of the inventive concept.
Figure 5B:
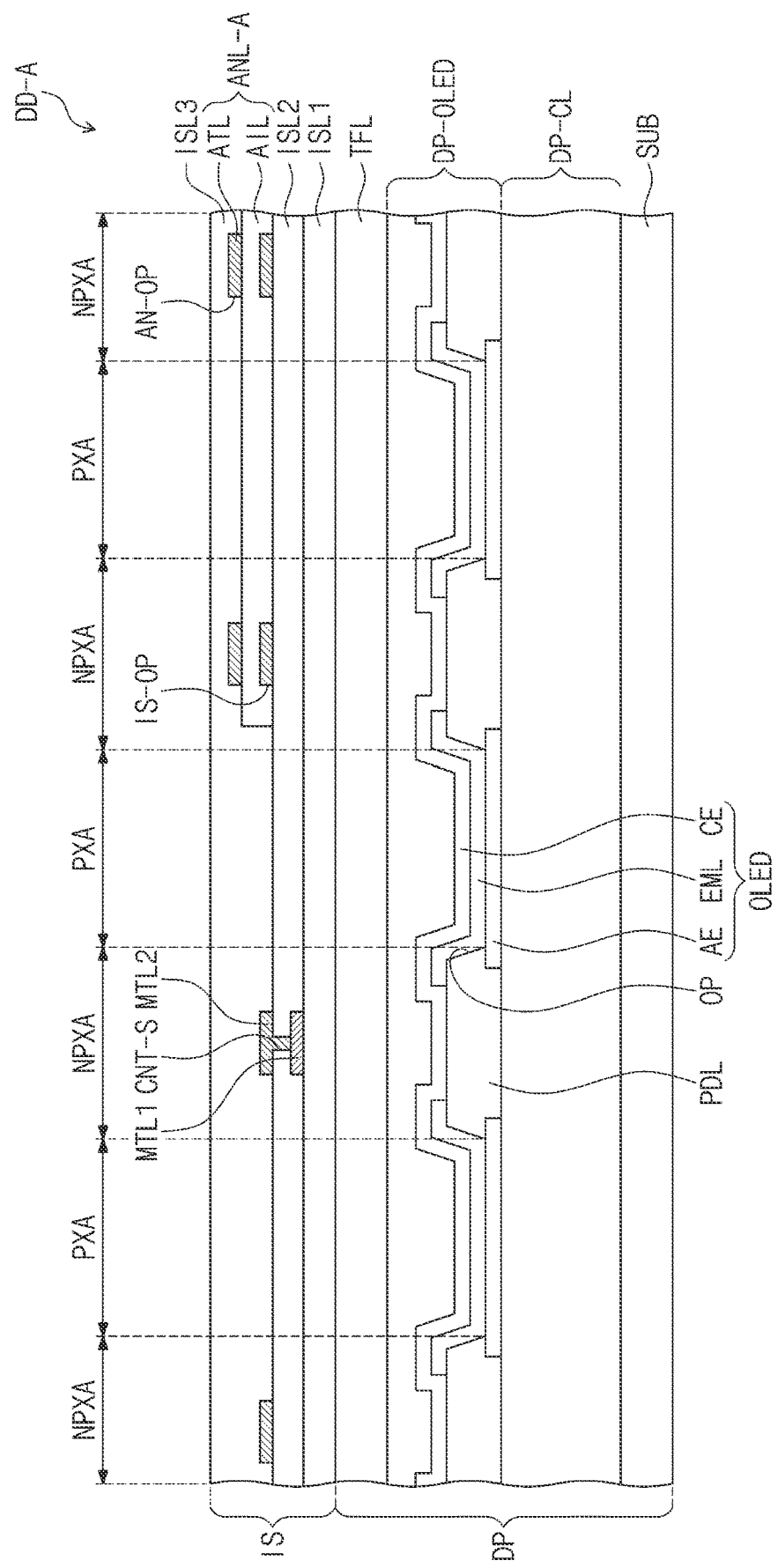
FIG. 5B is a sectional view illustrating an electronic device according to an embodiment of the inventive concept.

FIG. 5A is a sectional view illustrating an electronic device according to an embodiment of the inventive concept. FIG. 5B is a sectional view illustrating an electronic device according to an embodiment of the inventive concept.

Some elements of the display layer DP described with reference to FIG. 4 are omitted in FIGS. 5A and 5B, and only the light-emitting device OLED which includes the first electrode AE, the emission layer EML, and the second electrode CE, and the pixel definition layer PDL with the display opening OP are illustrated in FIGS. 5A and 5B.

Referring to FIG. 5A, the sensor layer IS according to an embodiment of the inventive concept may be directly disposed on the thin encapsulation layer TFL. The sensor layer IS may include sensing insulating layers ISL1, ISL2, and ISL3 and conductive layers MTL1 and MTL2.

The sensing insulating layers ISL1, ISL2, and ISL3 of the sensor layer IS may include at least one inorganic layer. For example, each of the first and second sensing insulating layer ISL1 and ISL2 may be an inorganic layer, and a third sensing insulating layer ISL3 may be an organic layer.

A first conductive layer MTL1 may be disposed on the first sensing insulating layer ISL1 and may be covered with the second sensing insulating layer ISL2. A second conductive layer MTL2 may be disposed on the second sensing insulating layer ISL2 and may be covered with the third sensing insulating layer ISL3. A portion of the second conductive layer MTL2 may be connected to a portion of the first conductive layer MTL1 through a contact hole CNT-S which is defined in the second sensing insulating layer ISL2.

In the present embodiment, the antenna layer ANL may be disposed on the sensor layer IS. For example, the antenna layer ANL may be disposed on the third sensing insulating layer ISL3.

The antenna layer ANL may include an antenna ATL and an antenna insulating layer AIL. The antenna ATL and the antenna insulating layer AIL may be disposed on the third sensing insulating layer ISL3. In an embodiment, an area of the antenna insulating layer AIL may be smaller than an area of the third sensing insulating layer ISL3. The antenna insulating layer AIL may be an inorganic layer or an organic layer.

Referring to FIG. 5B, a display device DD-A according to an embodiment of the inventive concept may include an antenna layer ANL-A which is disposed in the sensor layer IS. For example, the antenna layer ANL may be disposed between the second sensing insulating layer ISL2 and the third sensing insulating layer ISL3.

The antenna layer ANL-A may include the antenna ATL and the antenna insulating layer AIL. The antenna ATL may be disposed on the antenna insulating layer AIL, and the antenna insulating layer AIL may be disposed on the second sensing insulating layer ISL2 and may be covered with the third sensing insulating layer ISL3. In an embodiment, an area of the antenna insulating layer AIL may be smaller than an area of the third sensing insulating layer ISL3. The antenna insulating layer AIL may be an inorganic layer or an organic layer.

However, the inventive concept is not limited to this example, and in an embodiment, positions of the third sensing insulating layer ISL3 and the antenna insulating layer AIL of the antenna layer ANL or ANL-A may be changed. For example, the third sensing insulating layer ISL3 may be provided to cover a portion of the second conductive layer MTL2, and the antenna insulating layer AIL may be provided on the third sensing insulating layer ISL3 to cover the third sensing insulating layer ISL3 and a remaining portion of the second conductive layer MTL2.

Figure 6A:
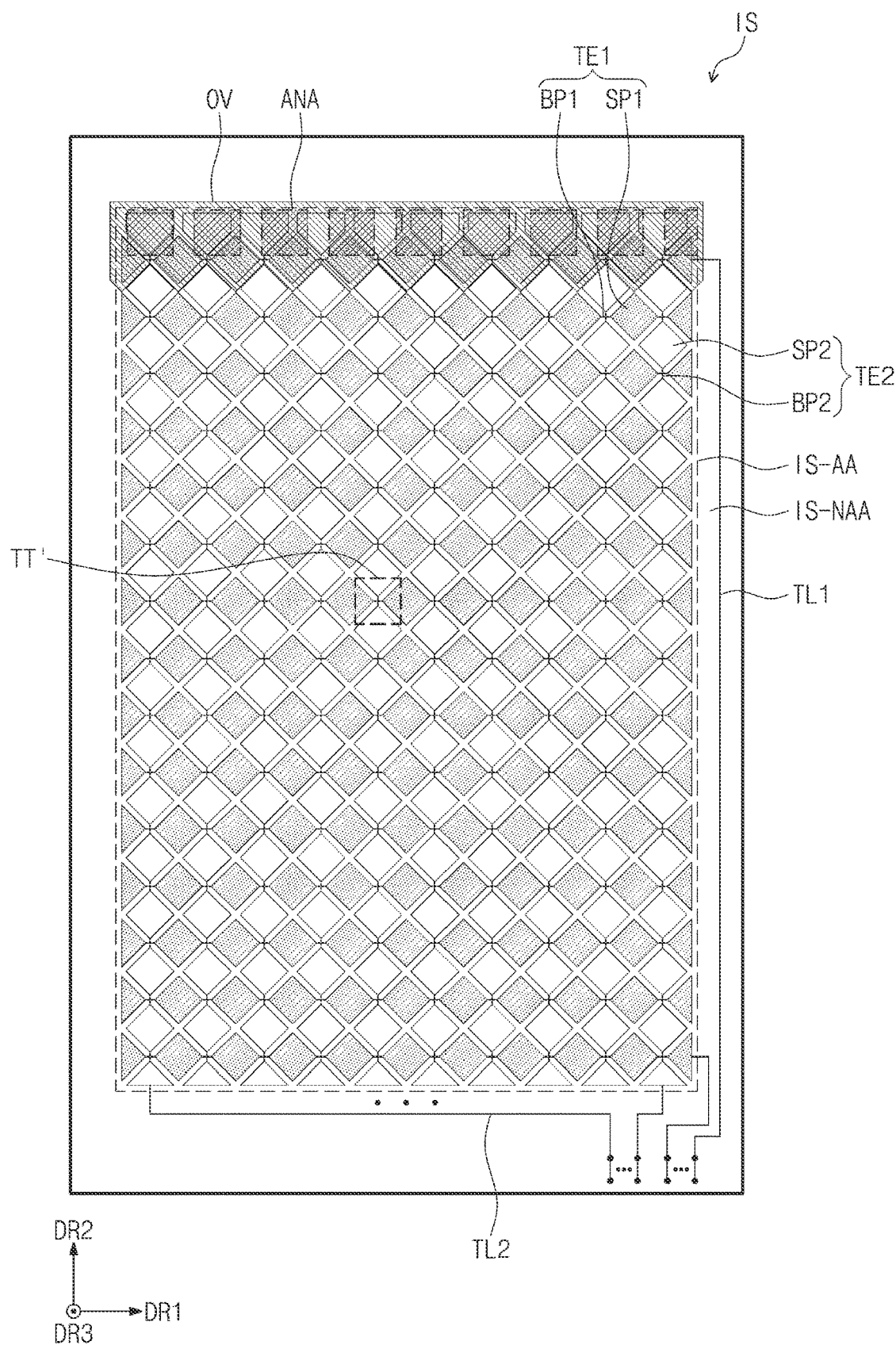
FIG. 6A is a plan view illustrating a sensor layer according to an embodiment of the inventive concept.
Figure 6B:
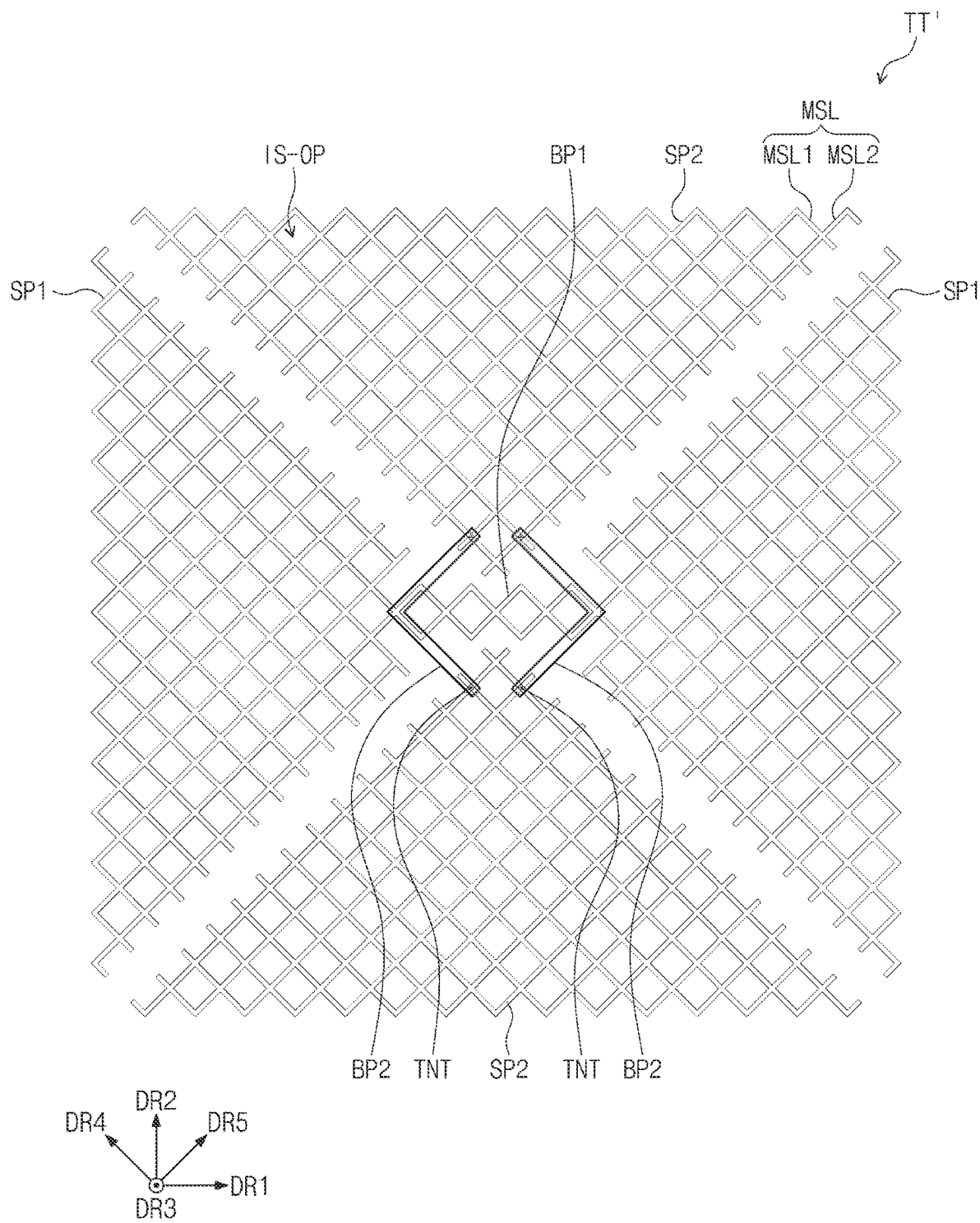
FIG. 6B is an enlarged plan view illustrating a portion TT' of FIG. 6A.

FIG. 6A is a plan view illustrating a sensor layer according to an embodiment of the inventive concept. FIG. 6B is an enlarged plan view illustrating a portion TT' of FIG. 6A.

Referring to FIGS. 6A and 6B, an active region IS-AA and a peripheral region IS-NAA surrounding the active region IS-AA may be included in the sensor layer IS. The active region IS-AA may be a region which is activated by an electrical signal applied thereto. For example, the active region IS-AA may be configured to sense an input. When viewed in a plan view, the active region IS-AA may be overlapped with the active region DP-AA of the display layer DP (e.g., see FIG. 3) and the peripheral region IS-NAA may be overlapped with the peripheral region DP-NAA of the display layer DP (e.g., see FIG. 3).

The sensor layer IS may include a plurality of first sensing electrodes TE1, a plurality of second sensing electrodes TE2, and a plurality of sensing lines TL1 and TL2. The first and second sensing electrodes TE1 and TE2 may be disposed in the active region IS-AA and the sensing lines TL1 and TL2 may be disposed in the peripheral region IS-NAA.

The sensor layer IS may be configured to obtain information on an external input based on a variation in capacitance between the first and second sensing electrodes TE1 and TE2.

The first sensing electrodes TE1 may extend in the first direction DR1 and may be arranged in the second direction DR2. Each of the first sensing electrodes TE1 may include a plurality of first sensing patterns SP1 and a plurality of first conductive patterns BP1. Each of the first conductive patterns BP1 may be disposed between two adjacent first sensing patterns SP1. In an embodiment, the first sensing patterns SP1 and the first conductive patterns BP1 may be provided to form a single object. Thus, each of the first sensing electrodes TE1 may be provided as a single pattern.

The second sensing electrodes TE2 may extend in the second direction DR2 and may be arranged in the first direction DR1. Each of the second sensing electrodes TE2 may include a plurality of second sensing patterns SP2 and a plurality of second conductive patterns BP2. Each of the second conductive patterns BP2 may be provided to electrically connect two adjacent second sensing patterns SP2 to each other. In an embodiment, the second sensing patterns SP2 and the second conductive patterns BP2 may be provided at different levels or on different layers.

The sensing lines TL1 and TL2 may include a plurality of first sensing lines TL1 and a plurality of second sensing lines TL2. The first sensing lines TL1 may be electrically connected to the first sensing electrodes TE1, respectively. The second sensing lines TL2 may be electrically connected to the second sensing electrodes TE2, respectively.

The first sensing pads TD1 (e.g., see FIG. 3) may be electrically connected to the first sensing lines TL1, respectively, through contact holes. The second sensing pads TD2

(e.g., see FIG. 3) may be electrically connected to the second sensing lines TL2, respectively, through contact holes.

The plan view of FIG. 6B illustrates the disposition of the first sensing patterns SP1, the first conductive patterns BP1, the second sensing patterns SP2, and the second conductive patterns BP2 according to an embodiment of the inventive concept.

In the present embodiment, each of the first sensing patterns SP1, the second sensing patterns SP2, and the second conductive patterns BP2 may include a conductive line MSL. The conductive line MSL may include a first sensing conductive line MSL1 which extends in a fourth direction DR4 and a second sensing conductive line MSL2 which is extended in a fifth direction DR5.

The sensing conductive lines MSL1 and MSL2 may be overlapped with the non-light-emitting region NPXA of FIG. 4 but not be overlapped with the light-emitting region PXA. The sensing conductive lines MSL1 and MSL2 may be provided to cross each other to define a plurality of sensing openings IS-OP. The sensing conductive lines MSL1 and MSL2 may have a linewidth ranging from several micrometers to several nanometers. The sensing openings IS-OP may correspond to the light-emitting regions PXA (e.g., see FIG. 4) which are provided in every pixel PX (e.g., see FIG. 3) in a one-to-one correspondence.

In the present embodiment, the first sensing patterns SP1, the second sensing patterns SP2, and the second conductive patterns BP2 may be included in the second conductive layer MTL2 described with reference to FIG. 5A. The first conductive patterns BP1 may be included in the first conductive layer MTL1 described with reference to FIG. 5A.

The first sensing patterns SP1 may be connected to a corresponding one of the first conductive patterns BP1 through sensing contact holes TNT formed through a second sensing insulating layer ISL2. Thus, even when the first sensing patterns SP1 are disposed at the same level as the second sensing electrode TE2, the first sensing patterns SP1 may be electrically connected to each other through the first conductive pattern BP1 which is disposed on a first sensing insulating layer ISL1 while being electrically disconnected from the second sensing electrode TE2. Thus, the first conductive pattern BP1 and the second conductive pattern BP2 which are disposed at different levels or on different layers may be overlapped with each other when viewed in a plan view.

A portion of each of the sensing lines TL1 and TL2 may be included in the first conductive layer MTL1 and a remaining portion may be included in the second conductive layer MTL2. Interconnection lines, which are disposed at different levels or on different layers, may be connected to each other through contact holes which are defined in the second sensing insulating layer ISL2. However, the inventive concept is not limited to this example, and the sensing lines TL1 and TL2 may be included in only one of the first and second conductive layers MTL1 and MTL2.

In an embodiment, at least one of the first and second sensing patterns SP1 and SP2 may be overlapped with an antenna pattern ANT to be described below (e.g., see FIG. 7). A region ANA provided with the antenna pattern ANT is depicted by a dotted line in the plan view of FIG. 6A. In an embodiment, some of the sensing patterns which are included in the sensing electrodes TE1 and TE2 and are at least partially overlapped with the antenna pattern ANT may constitute a pattern group OV.

In the present specification, patterns included in the pattern group OV may be defined as "first patterns", and sensing patterns of the sensing electrodes TE1 and TE2 which are not included in the pattern group OV (i.e., not overlapped with the antenna pattern ANT when viewed in a plan view) may be defined as "second patterns".

Figure 7:
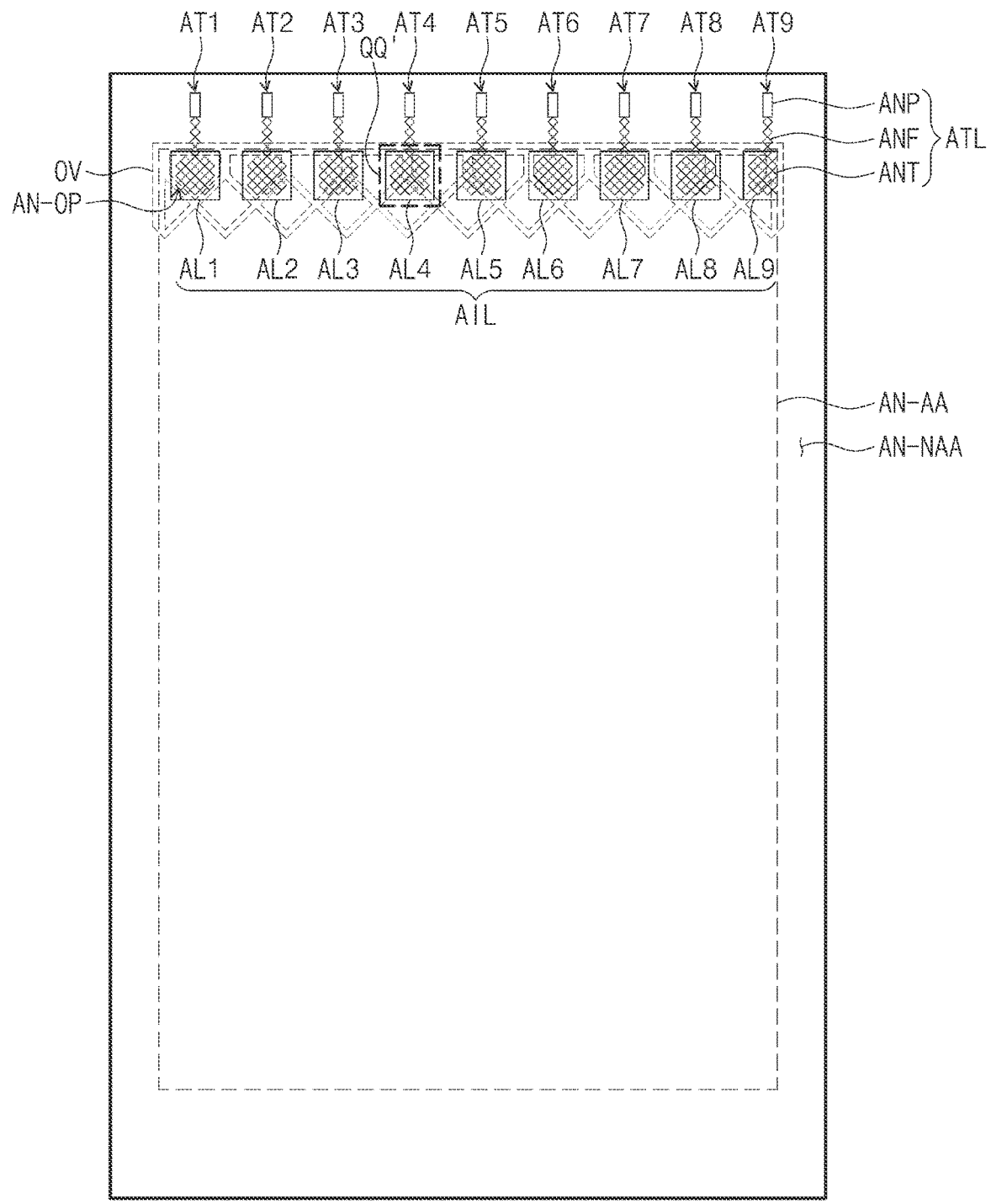
FIG. 7 is a plan view illustrating an antenna layer according to an embodiment of the inventive concept.
Figure 8:
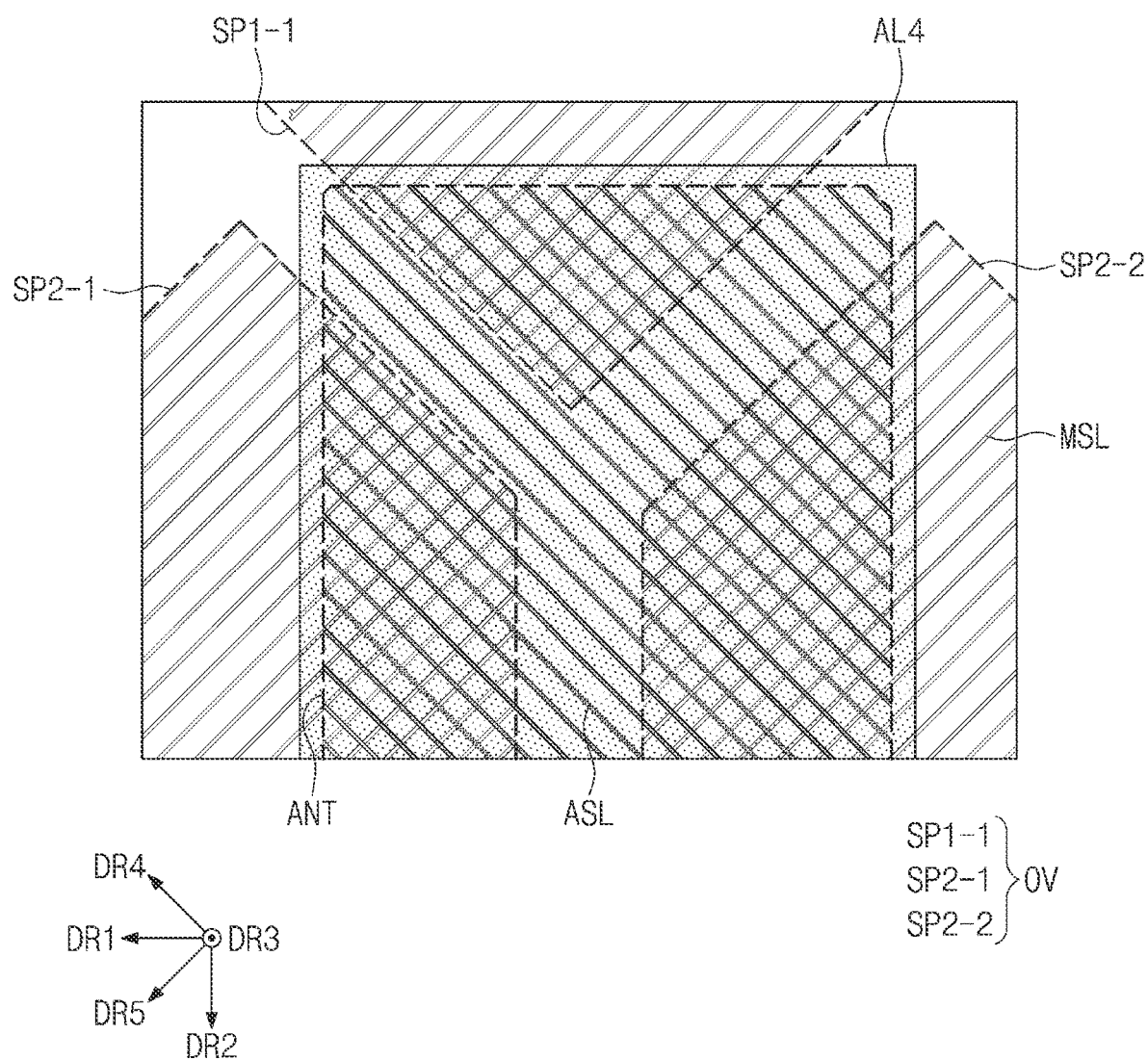
FIG. 8 is an enlarged plan view illustrating a portion QQ' of FIG. 7.

FIG. 7 is a plan view illustrating an antenna layer according to an embodiment of the inventive concept. FIG. 8 is an enlarged plan view illustrating a portion QQ' of FIG. 7.

Referring to FIG. 7, a plurality of antennas AT1 to AT9 may be arranged to be spaced apart from each other in the first direction DR1. The electronic device DD (e.g., see FIG. 1) may include short sides parallel to the first direction DR1 and long sides parallel to the second direction DR2. In an embodiment, the antennas AT1 to AT9 may be disposed near an upper short side of the electronic device DD. However, the inventive concept is not limited to this example, and at least one of the antennas AT1 to AT9 may be omitted or the antennas AT1 to AT9 may be arranged near one of the long sides of the electronic device DD.

In an embodiment, the antennas AT1 to AT9 may be disposed on the antenna insulating layers AL1 to AL9, respectively (i.e., in a one-to-one correspondence). The antenna insulating layers AL1 to AL9 may be arranged to be spaced apart from each other in the first direction DR1. In an embodiment, the antenna insulating layer may be a single pattern which is disposed to overlapped with a plurality of antennas in common, but the inventive concept is not limited to this example or a specific embodiment.

Each antenna ATL may include an antenna pattern ANT, an antenna line ANF, and an antenna pad ANP. All of the antennas AT1 to AT9 may have the same features as the antenna ATL to be described below. The antenna pattern ANT and at least a portion of the antenna line ANF may be disposed in an active region AN-AA, and a remaining portion of the antenna line ANF and the antenna pad ANP may be disposed in a peripheral region AN-NAA. Since an area of the active region DP-AA (e.g., see FIG. 3) is secured, it may be possible to easily secure a space for the antenna pattern ANT, even when a size or thickness of the electronic device DD (e.g., see FIG. 1) or an area of the peripheral region DP-NAA (e.g., see FIG. 3) is reduced.

The antenna ANL may be operated within a specific frequency range. The frequency range may include a resonance frequency. In an embodiment, the resonance frequency may be 28 GHz. However, this frequency is just one example, and in an embodiment, the resonance frequency is not limited to this frequency. For example, the resonance frequency may be changed depending on a frequency range of communication signals to be used.

Each of the antenna pattern ANT may have a first width in the first direction DR1 and a second width in the second direction DR2. The second width may be inversely proportional to the resonance frequency. However, the inventive concept is not limited to this example, and each of the first and second widths may be determined based on a dielectric material disposed below the antenna pattern ANT and a frequency range of communication signals to be used.

The antenna pattern ANT may be overlapped with one of the first patterns which are included in the pattern group OV. The antenna pattern ANT may include antenna openings AN-OP which are defined by a plurality of conductive lines that are formed to cross each other. An area of each of the antenna openings AN-OP may be larger than an area of the light-emitting region PXA (e.g., see FIG. 4). Thus, an image which is emitted from the active region DP-AA (e.g., see FIG. 3) may be transmitted to the outside through the antenna openings AN-OP. The shape of the antenna pattern ANT in the active region AN-AA may be variously changed, and this may increase a degree of freedom in designing the antenna pattern ANT.

The antenna line ANF may be connected to a portion of the antenna pattern ANT. The antenna line ANF may extend from the antenna pattern ANT toward the peripheral region AN-NAA to the antenna pad ANP. The antenna line ANF may be used to supply electricity to the antenna pattern ANT.

The antenna line ANF and the antenna pattern ANT may be formed of or include the same material and may be formed by the same process. The antenna pattern ANT may be formed of or include at least one of carbon nanotube, metallic materials, metal alloys, or composite materials thereof and may have a single-layered structure or a multi-layered structure in which titanium (Ti), aluminum (Al), and titanium (Ti) layers are sequentially stacked. For example, the metallic materials may include silver (Ag), copper (Cu), aluminum (Al), gold (Au), or platinum (Pt), but the inventive concept is not limited to this example.

Each of the antenna line ANF may have a first width in the first direction DR1 and may have a second width in the second direction DR2. The second width may be chosen to have a value that is suitable for an impedance matching between the antenna pattern ANT and the antenna line ANF. Thus, the transmission efficiency of a signal between the antenna line ANF and the antenna pattern ANT may be improved, and the display device DD (e.g., see FIG. 1) with improved communication efficiency may be provided.

The antenna pad ANP may be connected to a portion of the antenna line ANF. The antenna pad ANP may be disposed in the peripheral region AN-NAA.

FIG. 8 illustrates first patterns SP1-1, SP2-1, and SP2-2 which are overlapped with the antenna pattern ANT of a fourth antenna AL4 of the pattern group OV and the antenna pattern ANT. The antenna insulating layer may correspond to one of the antenna insulating layers AIL described with reference to FIGS. 5A and 5B.

In an embodiment, the antenna pattern ANT may include first antenna conductive lines ASL. The first antenna conductive lines ASL may extend in the fourth direction DR4 and may be arranged to be spaced apart from each other in the fifth direction DR5.

The first patterns may include second sensing patterns SP2-1 and SP2-2 which are respectively included in two different second sensing electrodes TE2 (e.g., see FIG. 6A) receiving different signals, and the first sensing pattern SP1-1 which is included in one of the first sensing electrodes TE1 (e.g., see FIG. 6A).

Each of the first patterns SP1-1, SP2-1, and SP2-2 may include first sensing conductive lines MSL. The first sensing conductive lines MSL may extend in the fifth direction DR5 and may be arranged to be spaced apart from each other in the fourth direction DR4.

The light-emitting regions PXA (e.g., see FIG. 4) may be disposed between adjacent first antenna conductive lines ASL and the light-emitting regions PXA (e.g., see FIG. 4) may be disposed between adjacent first sensing conductive lines MSL.

In an embodiment, the first antenna conductive lines ASL in the antenna pattern ANT and the first sensing conductive lines MSL in the first patterns SP1-1, SP2-1, and SP2-2 may be overlapped with the non-light-emitting region NPXA of FIG. 4 and may be spaced apart from the light-emitting region PXA. In other words, the first antenna conductive lines ASL and the first sensing conductive lines MSL may not affect an optical path of light that is emitted from the light-emitting device OLED (e.g., see FIG. 4).

In an embodiment, the first antenna conductive lines ASL and the first sensing conductive lines MSL may not include conductive lines extending in the same direction. Accordingly, it may be possible to prevent a signal interference issue and a coupling phenomenon which may occur when the first antenna conductive lines ASL and the first sensing conductive lines MSL are overlapped with each other when viewed in a plan view. Thus, it may be possible to improve the antenna performance and sensing performance of the electronic device DD (e.g., see FIG. 1).

Figure 9:
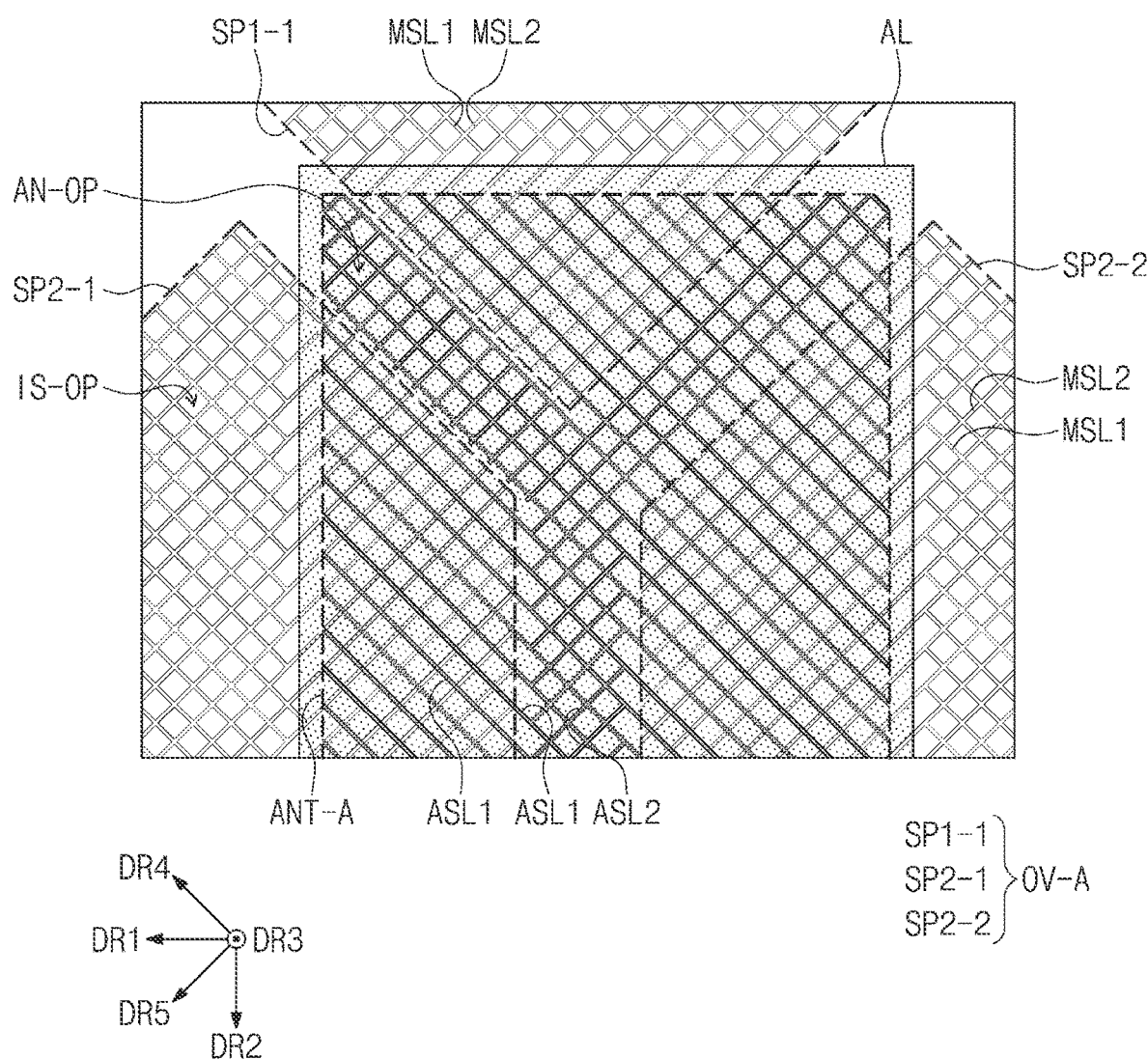
FIG. 9 is a plan view illustrating an arrangement of an antenna pattern and a sensor pattern according to an embodiment of the inventive concept.

FIG. 9 is a plan view illustrating an arrangement of an antenna pattern and a sensor pattern according to an embodiment of the inventive concept. FIG. 9 illustrates a region corresponding to FIG. 8. For concise description, an element previously described with reference to FIGS. 1 to 8 may be identified by the same or similar reference number without repeating an overlapping description thereof. An antenna insulating layer AL may correspond to one of the antenna insulating layers AIL described with reference to FIGS. 5A and 5B.

Referring to FIG. 9, an antenna pattern ANT-A may include first and second antenna conductive lines ASL1 and ASL2. The first antenna conductive lines ASL1 may extend in the fourth direction DR4 and may be arranged to be spaced apart from each other in the fifth direction DR5. The second antenna conductive lines ASL2 may extend in the fifth direction DR5 and may be arranged to be spaced apart from each other in the fourth direction DR4.

In the present embodiment, densities of the first and second antenna conductive lines ASL1 and ASL2 may vary depending on a position in the antenna pattern ANT-A. For example, a portion of the antenna pattern ANT-A overlapped with the first patterns SP1-1, SP2-1, and SP2-2 may include only the first antenna conductive lines ASL1 and may not include the second antenna conductive lines ASL2.

Thus, in a region in which the antenna pattern ANT-A is overlapped with the first patterns SP1-1, SP2-1, and SP2-2, a plurality of light-emitting regions PXA (e.g., see FIG. 4) may be disposed between adjacent first antenna conductive lines ASL1, and in a region in which the antenna pattern ANT-A is not overlapped with the first patterns SP1-1, SP2-1, and SP2-2, one light-emitting region PXA (e.g., see FIG. 4) may be disposed in the antenna opening AN-OP defined by the first and second antenna conductive lines ASL1 and ASL2.

Each of the first patterns SP1-1, SP2-1, and SP2-2 of a pattern group OV-A may include the first and second sensing conductive lines MSL1 and MSL2. The first sensing conductive lines MSL1 may extend in the fourth direction DR4 and may be arranged to be spaced apart from each other in the fifth direction DR5. The second sensing conductive lines MSL2 may extend in the fifth direction DR5 and may be arranged to be spaced apart from each other in the fourth direction DR4.

In the present embodiment, densities of the first and second sensing conductive lines MSL1 and MSL2 may vary depending on a position in each of the first patterns SP1-1, SP2-1, and SP2-2. For example, a portion of the first patterns SP1-1, SP2-1, and SP2-2, which are overlapped with the antenna pattern ANT-A, may include only the second sensing conductive lines MSL2 and may not include the first sensing conductive lines MSL1.

Thus, in a region in which the first patterns SP1-1, SP2-1, and SP2-2 are overlapped with the antenna pattern ANT-A, a plurality of light-emitting regions PXA (e.g., see FIG. 4) may be disposed between adjacent second sensing conductive lines MSL2, and in a region in which the first patterns SP1-1, SP2-1, and SP2-2 are not overlapped with the antenna pattern ANT-A, one light-emitting region PXA (e.g., see FIG. 4) may be disposed in a sensing opening IS-OP defined by the first and second sensing conductive lines MSL1 and MSL2.

According to the present embodiment, since only conductive lines extending in different directions are disposed in the overlapping region between the antenna pattern ANT-A and the first patterns SP1-1, SP2-1, and SP2-2 and conductive lines which has a density similar to the second patterns are disposed in the non-overlapping region, it may be possible to improve the antenna performance and sensing performance of the electronic device DD (e.g., see FIG. 1).

Figure 10:
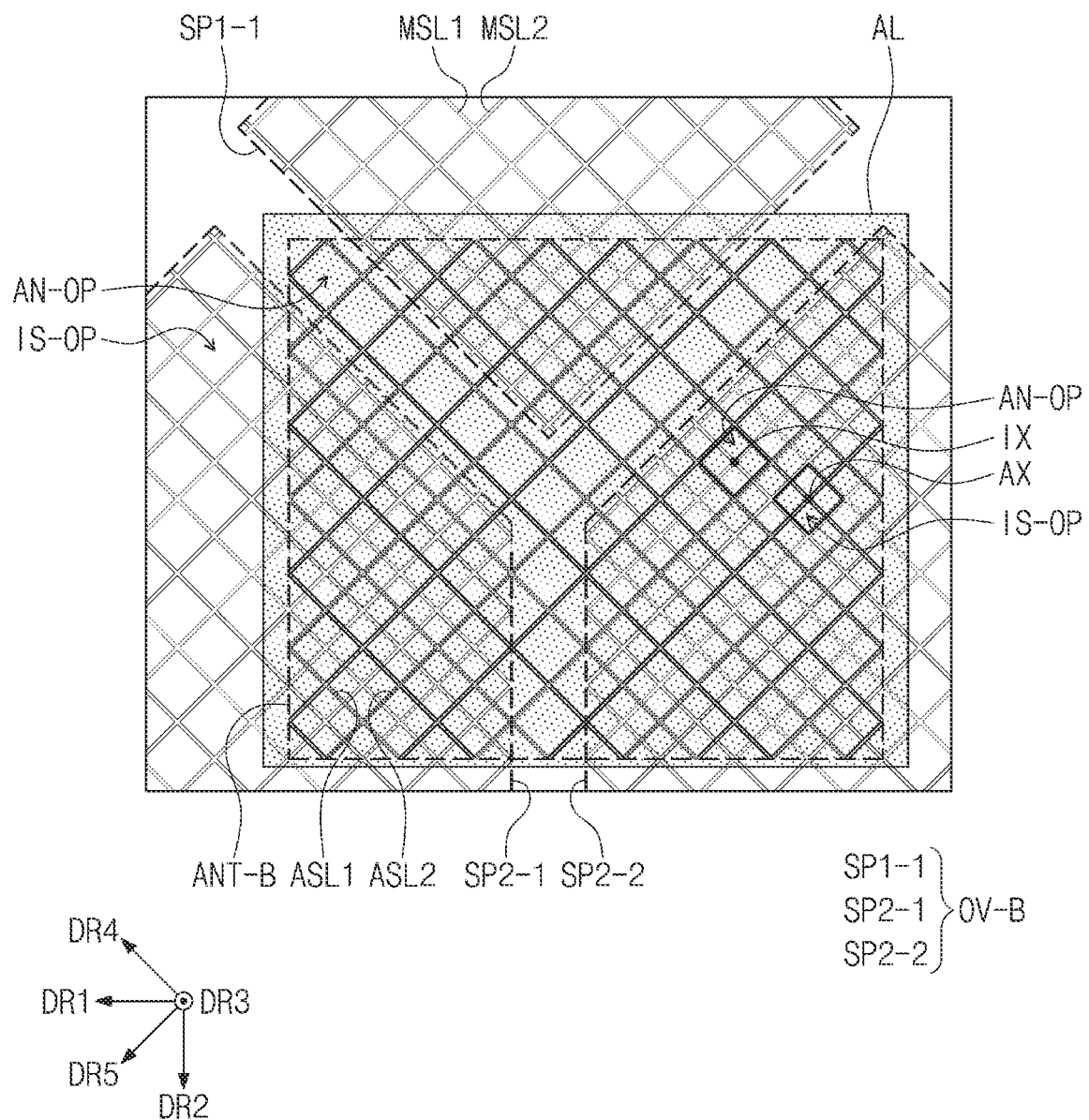
FIG. 10 is a plan view illustrating an arrangement of an antenna pattern and a sensor pattern according to an embodiment of the inventive concept.
Figure 11:
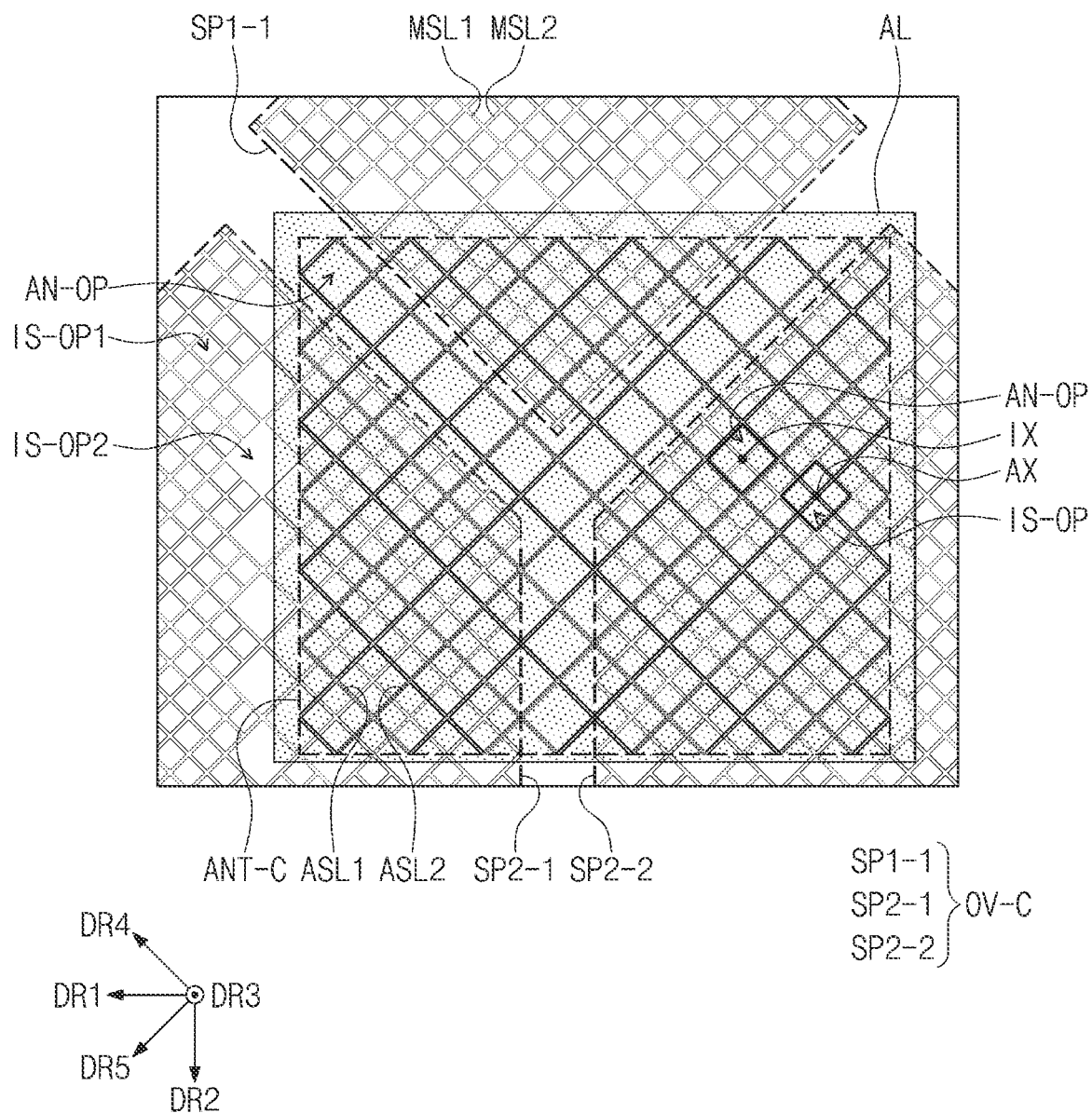
FIG. 11 is a plan view illustrating an arrangement of an antenna pattern and a sensor pattern according to an embodiment of the inventive concept.

FIG. 10 is a plan view illustrating an arrangement of an antenna pattern and a sensor pattern according to an embodiment of the inventive concept. FIG. 11 is a plan view illustrating an arrangement of an antenna pattern and a sensor pattern according to an embodiment of the inventive concept. Each of FIGS. 10 and 11 illustrates a region corresponding to FIG. 8. The antenna insulating layer AL of FIGS. 10 and 11 may correspond to one of the antenna insulating layers AIL described with reference to FIGS. 5A and 5B.

Referring to FIG. 10, an antenna pattern ANT-B may include the first and second antenna conductive lines ASL1 and ASL2. The first antenna conductive lines ASL1 may extend in the fourth direction DR4 and may be arranged to be spaced apart from each other in the fifth direction DR5. The second antenna conductive lines ASL2 may extend in the fifth direction DR5 and may be arranged to be spaced apart from each other in the fourth direction DR4.

The first and second antenna conductive lines ASL1 and ASL2 may be provided to cross each other and to define the antenna openings AN-OP. In the present embodiment, a plurality of light-emitting regions PXA (e.g., see FIG. 4) may be disposed in one antenna opening AN-OP. Thus, an area of the antenna opening AN-OP may be larger than an area of the sensing opening IS-OP (e.g., see FIG. 6B) defined in the second patterns.

Each of the first patterns SP1-1, SP2-1, and SP2-2 of a pattern group OV-B may include the first and second sensing conductive lines MSL1 and MSL2. The first sensing conductive lines MSL1 may extend in the fourth direction DR4 and may be arranged to be spaced apart from each other in the fifth direction DR5. The second sensing conductive lines MSL2 may extend in the fifth direction DR5 and may be arranged to be spaced apart from each other in the fourth direction DR4.

The first and second sensing conductive lines MSL1 and MSL2 may be provided to cross each other and thereby to define the sensing openings IS-OP. In the present embodiment, a plurality of light-emitting regions PXA (e.g., see FIG. 4) may be disposed in one sensing opening IS-OP. Thus, an area of the sensing opening IS-OP defined in the first patterns SP1-1, SP2-1, and SP2-2 may be larger than an area of the sensing opening IS-OP (e.g., see FIG. 6B) defined in the second patterns.

The first and second antenna conductive lines ASL1 and ASL2 are overlapped with each other at the first intersection points AX. In the present embodiment, each of the first intersection points AX may be disposed at a center of a corresponding sensing opening IS-OP.

In addition, the first and second sensing conductive lines MSL1 and MSL2 are overlapped with each other at the second intersection points IX. In the present embodiment, each of the second intersection points IX may be disposed at a center of a corresponding antenna opening AN-OP.

In other words, even when the antenna pattern ANT-B includes conductive lines that extend in the same direction as conductive lines included in the first patterns SP1-1, SP2-1, and SP2-2, it may be possible to minimize an interference issue between the antenna pattern ANT-B and the first patterns SP1-1, SP2-1, and SP2-2, because the conductive lines are disposed to have a structure minimizing an overlapping therebetween. Thus, it may be possible to improve the antenna performance and sensing performance of the electronic device DD (e.g., see FIG. 1).

Referring to FIG. 11, an antenna pattern ANT-C according to an embodiment of the inventive concept may include the first and second antenna conductive lines ASL1 and ASL2. The first antenna conductive lines ASL1 may extend in the fourth direction DR4 and may be arranged to be spaced apart from each other in the fifth direction DR5. The second antenna conductive lines ASL2 may extend in the fifth direction DR5 and may be arranged to be spaced apart from each other in the fourth direction DR4.

The first and second antenna conductive lines ASL1 and ASL2 may be provided to cross each other and to define the antenna openings AN-OP. In the present embodiment, a plurality of light-emitting regions PXA (e.g., see FIG. 4) may be disposed in one antenna opening AN-OP. Thus, an area of the antenna opening AN-OP may be larger than an area of the sensing opening IS-OP (e.g., see FIG. 6B) defined in the second patterns.

Each of the first patterns SP1-1, SP2-1, and SP2-2 of a pattern group OV-C may include the first and second sensing conductive lines MSL1 and MSL2. The first sensing conductive lines MSL1 may extend in the fourth direction DR4 and may be arranged to be spaced apart from each other in the fifth direction DR5. The second sensing conductive lines MSL2 may extend in the fifth direction DR5 and may be arranged to be spaced apart from each other in the fourth direction DR4.

In the present embodiment, densities of the first and second sensing conductive lines MSL1 and MSL2 may vary depending on a position in each of the first patterns SP1-1, SP2-1, and SP2-2. For example, in a region in which the first patterns SP1-1, SP2-1, and SP2-2 are not overlapped with the antenna pattern ANT-C, the first and second sensing conductive lines MSL1 and MSL2 may be provided to cross each other and to define first sensing openings IS-OP1. An area of one first sensing opening IS-OP1 may be equal to an area of the sensing opening IS-OP (e.g., see FIG. 6B) defined in the second patterns.

In a region in which the first patterns SP1-1, SP2-1, and SP2-2 are overlapped with the antenna pattern ANT-C, the first and second sensing conductive lines MSL1 and MSL2 may be provided to cross each other and to define second sensing openings IS-OP2. An area of one second sensing opening IS-OP2 may be larger than an area of the sensing opening IS-OP (e.g., see FIG. 6B) defined in the second patterns and may be similar to an area of the antenna opening AN-OP.

The first and second antenna conductive lines ASL1 and ASL2 are overlapped with each other at the first intersection points AX. In the present embodiment, each of the first intersection points AX may be disposed at a center of a corresponding sensing opening IS-OP.

In addition, the first and second sensing conductive lines MSL1 and MSL2 are overlapped with each other at a second intersection points IX. In the present embodiment, each of the second intersection points IX may be disposed in a corresponding antenna opening AN-OP.

According to the present embodiment, in a region in which the first patterns SP1-1, SP2-1, and SP2-2 are not overlapped with the antenna pattern ANT-C, conductive lines may be additionally disposed to increase a pattern density, and this may make it possible to improve the sensing performance of the electronic device DD (e.g., see FIG. 1).

Figure 12A:
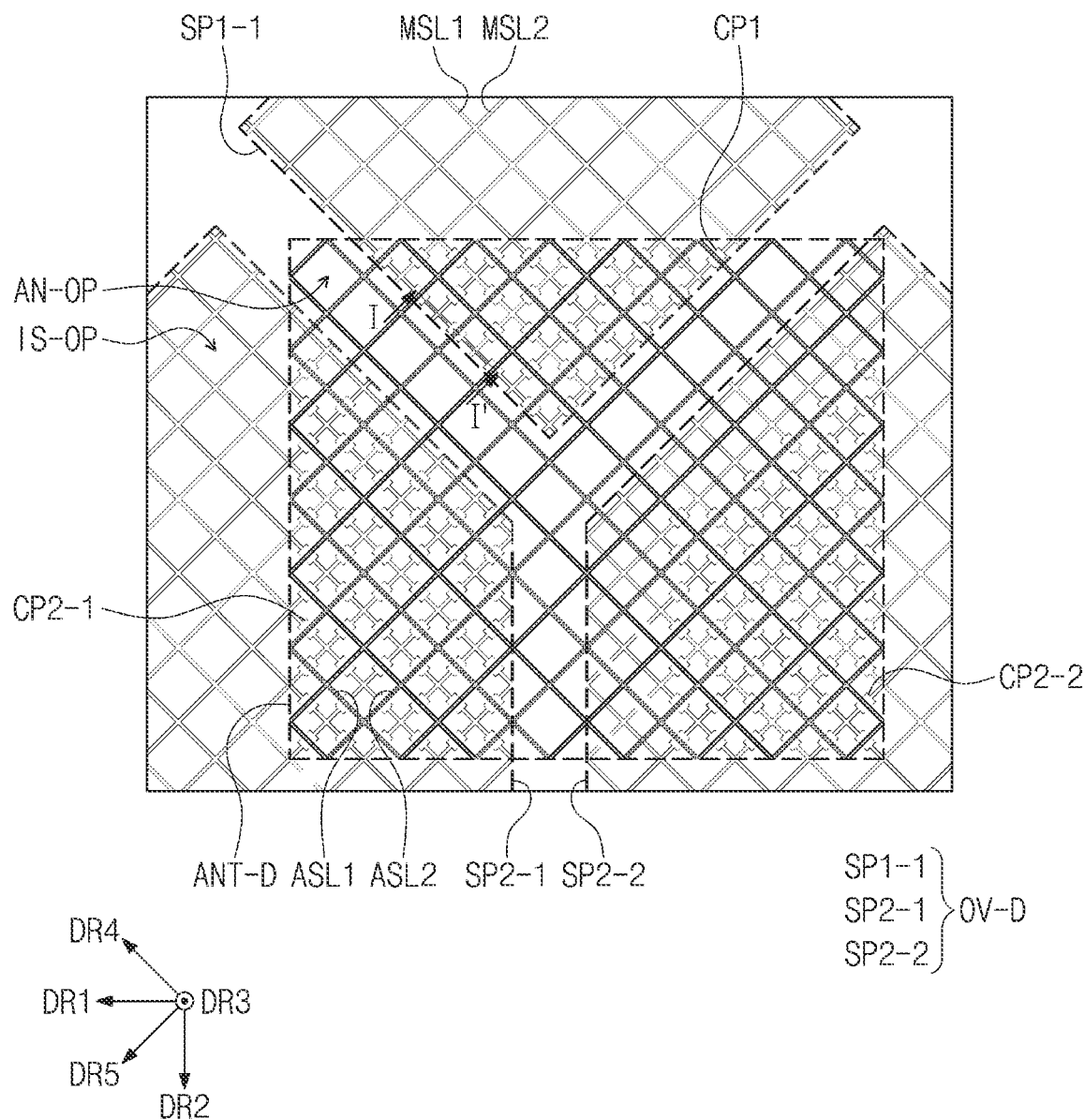
FIG. 12A is a plan view illustrating an arrangement of an antenna pattern and a sensor pattern according to an embodiment of the inventive concept.
Figure 12B:
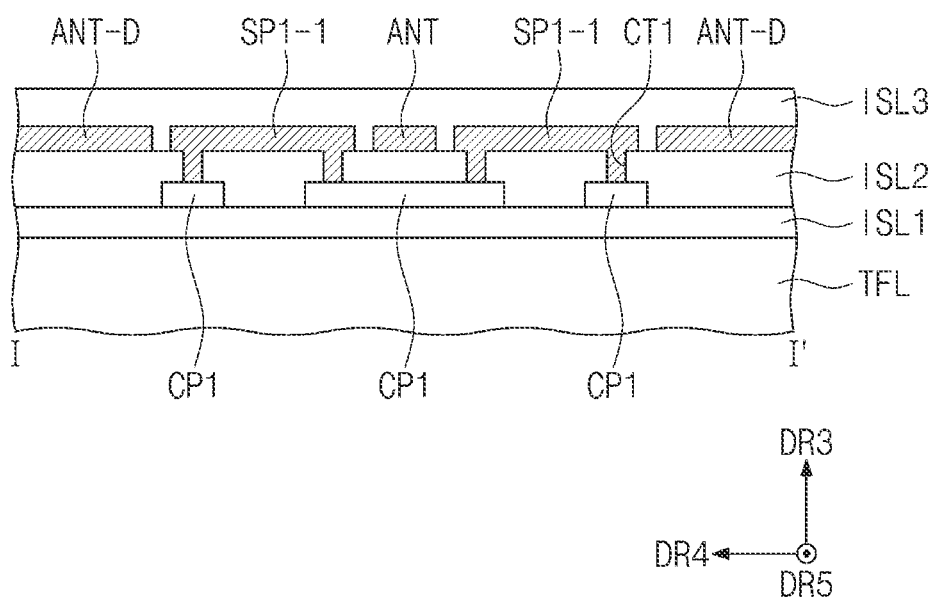
FIG. 12B is a sectional view taken along a line I-I' of FIG. 12A.

FIG. 12A is a plan view illustrating an arrangement of an antenna pattern and a sensor pattern according to an embodiment of the inventive concept. FIG. 12B is a sectional view taken along a line I-F of FIG. 12A. FIG. 12 illustrates a region corresponding to FIG. 8.

Referring to FIGS. 12A and 12B, the first patterns SP1-1, SP2-1, and SP2-2 of a pattern group OV-D and an antenna pattern ANT-D may be disposed at the same level or on the same layer. In other words, the antenna insulating layer AL described with reference to FIGS. 5A and 5B may be omitted, and the antenna pattern ANT-D may be disposed at the same level as the second conductive layer MTL2.

In an embodiment, the antenna pattern ANT-D may include the first and second antenna conductive lines ASL1 and ASL2. The first antenna conductive lines ASL1 may extend in the fourth direction DR4 and may be arranged to be spaced apart from each other in the fifth direction DR5. The second antenna conductive lines ASL2 may extend in the fifth direction DR5 and may be arranged to be spaced apart from each other in the fourth direction DR4.

The first and second antenna conductive lines ASL1 and ASL2 may be provided to cross each other and to define the antenna openings AN-OP. In the present embodiment, a plurality of light-emitting regions PXA (e.g., see FIG. 4) may be disposed in one antenna opening AN-OP. Thus, an area of the antenna opening AN-OP may be greater than an area of the sensing opening IS-OP (e.g., see FIG. 6B) defined in the second patterns.

Each of the first patterns SP1-1, SP2-1, and SP2-2 of the pattern group OV-D may include the first and second sensing conductive lines MSL1 and MSL2. In the present embodiment, each of the first patterns SP1-1, SP2-1, and SP2-2 may further include first bridge patterns CP1, CP2-1, and CP2-2.

The first sensing conductive lines MSL1 may extend in the fourth direction DR4 and may be arranged to be spaced apart from each other in the fifth direction DR5. The second sensing conductive lines MSL2 may extend in the fifth direction DR5 and may be arranged to be spaced apart from each other in the fourth direction DR4.

In portions of the first patterns SP1-1, SP2-1, and SP2-2, which are not overlapped with the antenna pattern ANT-D, the first and second sensing conductive lines MSL1 and MSL2 may be provided to cross each other and to define the sensing openings IS-OP. A plurality of light-emitting regions PXA (e.g., see FIG. 4) may be disposed in one sensing opening IS-OP. Thus, an area of the sensing opening IS-OP may be greater than an area of the sensing opening IS-OP (e.g., see FIG. 6B) defined in the second patterns.

Each of the first and second sensing conductive lines MSL1 and MSL2 may have disconnected portions at portions of the first patterns SP1-1, SP2-1, and SP2-2 overlapped with the antenna pattern ANT-D. Since the first patterns SP1-1, SP2-1, and SP2-2 and the antenna pattern ANT-D are disposed on the second sensing insulating layer ISL2, the first and second sensing conductive lines MSL1 and MSL2 crossing the antenna pattern ANT-D may be disconnected, when viewed in a plan view. The disconnected conductive lines may be connected to each other through the first bridge patterns CP1, CP2-1, and CP2-2. For example, the first bridge patterns CP1, CP2-1, and CP2-2 may be disposed on the first sensing insulating layer ISL1 and may connect the cut conductive lines through first contact holes CT1 defined in the second sensing insulating layer IL2.

According to the present embodiment, by disposing the sensing patterns in the sensor layer IS (e.g., see FIG. 2) and the antenna pattern ANT-D on the same layer or at the same level and omitting the antenna insulating layer, it may be possible to realize the electronic device DD (e.g., see FIG. 1) in a slim shape.

Figure 13A:
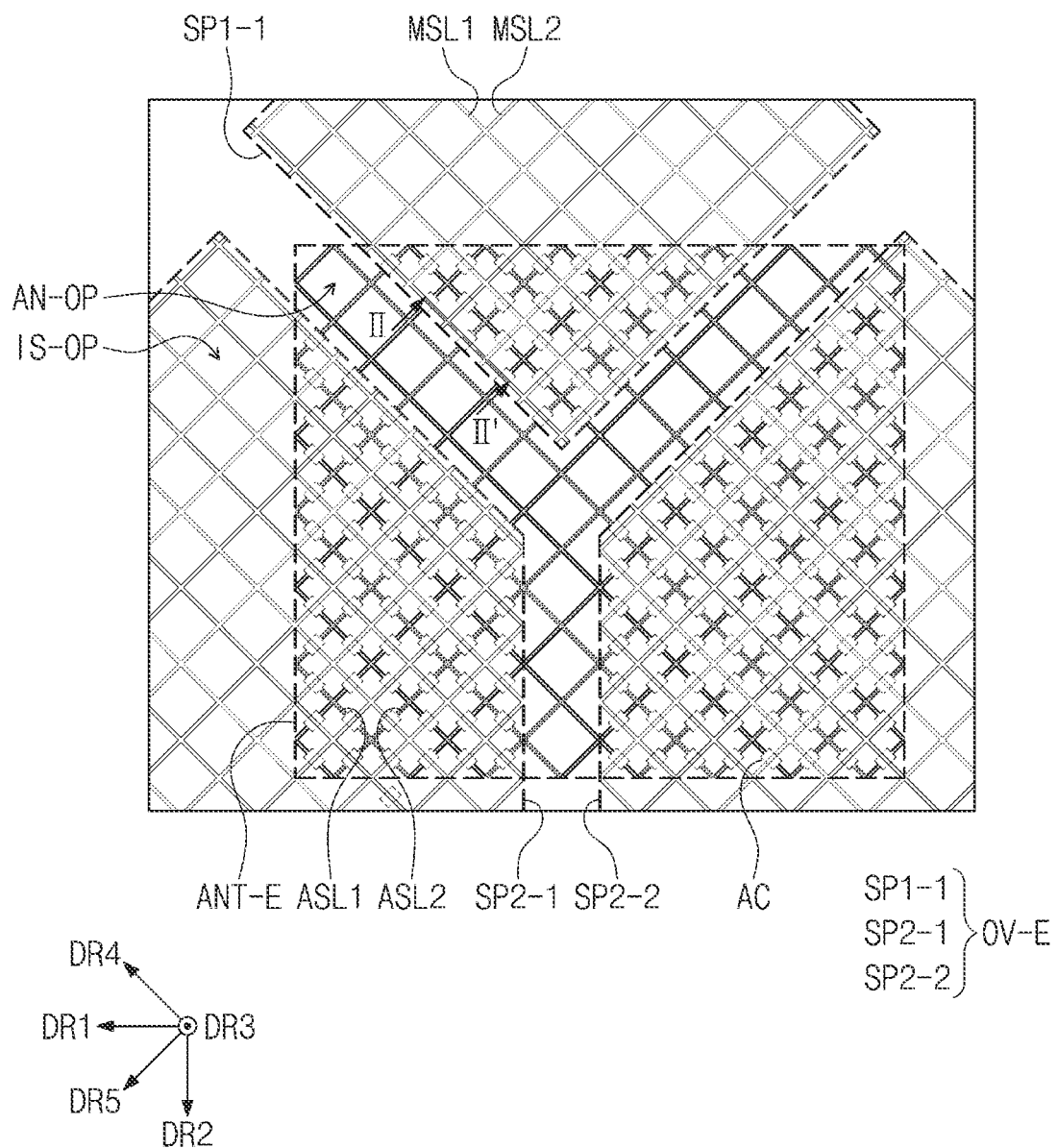
FIG. 13A is a plan view illustrating an arrangement of an antenna pattern and a sensor pattern according to an embodiment of the inventive concept.
Figure 13B:
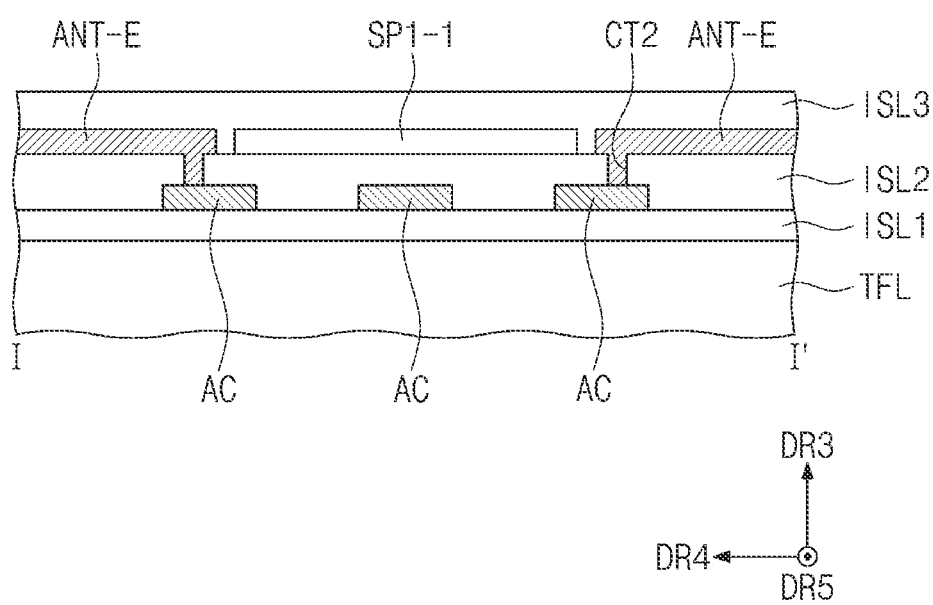
FIG. 13B is a sectional view taken along a line II-IT of FIG. 13A.

FIG. 13A is a plan view illustrating an arrangement of an antenna pattern and a sensor pattern according to an embodiment of the inventive concept. FIG. 13B is a sectional view taken along a line II-IT of FIG. 13A. FIG. 13 illustrates a region corresponding to FIG. 8. Referring to FIGS. 13A and 13B, the first patterns SP1-1, SP2-1, and SP2-2 of a pattern group OV-E and an antenna pattern ANT-E may be disposed at the same level or on the same layer. In other words, the antenna insulating layer AL described with reference to FIGS. 5A and 5B may be omitted, and the antenna pattern ANT-E may be disposed at the same level as the second conductive layer MTL2.

In an embodiment, the antenna pattern ANT-E may include the first and second antenna conductive lines ASL1 and ASL2. The first antenna conductive lines ASL1 may extend in the fourth direction DR4 and may be arranged to be spaced apart from each other in the fifth direction DR5. The second antenna conductive lines ASL2 may extend in the fifth direction DR5 and may be arranged to be spaced apart from each other in the fourth direction DR4.

In an embodiment, the antenna pattern ANT-E may further include second bridge patterns AC.

The first and second antenna conductive lines ASL1 and ASL2 may be provided to cross each other and to define the antenna openings AN-OP. In the present embodiment, a plurality of light-emitting regions PXA (e.g., see FIG. 4) may be disposed in one antenna opening AN-OP. Thus, an area of the antenna opening AN-OP may be greater than an area of the sensing opening IS-OP (e.g., see FIG. 6B) defined in the second patterns.

Each of the first patterns SP1-1, SP2-1, and SP2-2 of the pattern group OV-E may include the first and second sensing conductive lines MSL1 and MSL2. The first sensing conductive lines MSL1 may extend in the fourth direction DR4 and may be arranged to be spaced apart from each other in the fifth direction DR5. The second sensing conductive lines MSL2 may extend in the fifth direction DR5 and may be arranged to be spaced apart from each other in the fourth direction DR4.

In portions of the first patterns SP1-1, SP2-1, and SP2-2 which are not overlapped with the antenna pattern ANT-E, the first and second sensing conductive lines MSL1 and MSL2 may be provided to cross each other and to define the sensing openings IS-OP. A plurality of light-emitting regions PXA (e.g., see FIG. 4) may be disposed in one sensing opening IS-OP. Thus, an area of the sensing opening IS-OP may be greater than an area of the sensing opening IS-OP (e.g., see FIG. 6B) defined in the second patterns.

Each of the first and second antenna conductive lines ASL1 and ASL2 may have disconnected portions at a portion of the antenna pattern ANT-E overlapped with the first patterns SP1-1, SP2-1, and SP2-2. Since the first patterns SP1-1, SP2-1, and SP2-2 and the antenna pattern ANT-E are disposed on the second sensing insulating layer ISL2, the first and second antenna conductive lines ASL1 and ASL2 crossing the first patterns SP1-1, SP2-1, and SP2-2 may be disconnected, when viewed in a plan view.

The cut conductive lines may be connected to each other by the second bridge patterns AC.

For example, the second bridge patterns AC may be disposed on the first sensing insulating layer ISL1 and may connect the disconnected conductive lines through second contact holes CT2 which are formed in the second sensing insulating layer IL2.

In the present embodiment, by disposing the sensing patterns in the sensor layer IS (e.g., see FIG. 2) and the antenna pattern ANT-E on the same layer or at the same level and omitting the antenna insulating layer, it may be possible to realize the electronic device DD (e.g., see FIG. 1) in a slim shape.

According to an embodiment of the inventive concept, it may be possible to prevent a signal interference issue and a coupling phenomenon, which may occur when conductive lines in an antenna pattern and conductive lines in a sensing pattern are overlapped with each other. Thus, it may be possible to realize an electronic device with improved antenna performance and improved sensing performance.

While example embodiments of the inventive concept have been particularly shown and described, it will be understood by one of ordinary skill in the art that variations in form and detail may be made therein without departing from the spirit and scope of the attached claims.

What is claimed is:

1. An electronic device, comprising:
   a display layer comprising an active region which includes light-emitting regions and a non-light-emitting region disposed adjacent to the light-emitting regions, and a peripheral region which is disposed adjacent to the active region;
   an antenna pattern comprising first antenna conductive lines which extend in a first direction and are spaced apart from each other in a second direction crossing the first direction; and
   a sensor layer comprising a first pattern at least a portion of which is overlapped with the antenna pattern and a second pattern which is not overlapped with the antenna pattern,
   wherein the second pattern comprises first sensing conductive lines each of which extends in the first direction and second sensing conductive lines each of which extends in the second direction to cross the first sensing conductive lines, the first sensing conductive lines and the second sensing conductive lines defining first openings corresponding to the light-emitting regions,
   wherein the first pattern comprises third sensing conductive lines which extend in the second direction and are arranged to be spaced apart from each other in the first direction,
   wherein a portion of the first pattern does not include a conductive line extended in the first direction, and
   wherein a portion of the antenna pattern which is overlapped with the first pattern does not include a conductive line extended in the second direction.

2. The electronic device of claim 1, wherein each of the first pattern and the second pattern is provided in plural,
   wherein the sensor layer comprises a first sensing insulating layer disposed on the display panel, a second sensing insulating layer disposed on the first sensing insulating layer and defined first contact holes, a third sensing insulating layer disposed on the second sensing insulating layer, and at least one conductive pattern disposed between the first and second sensing insulating layers and overlapped with the contact holes,
   wherein the first patterns and the second patterns are disposed on the second sensing insulating layer, and
   wherein one of the first patterns and the second patterns is connected to the conductive pattern through the contact holes.

3. The electronic device of claim 2, further comprising an antenna insulating layer which is overlapped with at least three patterns of the first patterns.

4. The electronic device of claim 3, wherein the antenna insulating layer is disposed on the third sensing insulating layer.

5. The electronic device of claim 3, wherein the antenna insulating layer is disposed between the second sensing insulating layer and the third sensing insulating layer, and the antenna pattern is covered with the third sensing insulating layer.

6. The electronic device of claim 1, wherein the first pattern and the antenna pattern are disposed on the second sensing insulating layer and are covered with the third sensing insulating layer,
   wherein the third sensing conductive lines are disconnected at intersections with the first antenna conductive lines when viewed in a plan view,
   wherein the first pattern further comprises first bridge patterns overlapped with the disconnected portions of the sensing conductive lines, and
   wherein the first bridge patterns connect the third sensing conductive lines which are disconnected through second contact holes defined in the second sensing insulating layer.

7. The electronic device of claim 1, wherein the first pattern and the antenna pattern are disposed on the second sensing insulating layer and are covered with the third sensing insulating layer,
   wherein the first antenna conductive lines are disconnected at intersections with the third sensing conductive lines when viewed in a plan view,
   wherein the antenna pattern further comprises second bridge patterns overlapped with the disconnected portions of the antenna conductive lines, and
   wherein the second bridge patterns connect the first antenna conductive lines which are disconnected through third contact holes defined in the second sensing insulating layer.

8. The electronic device of claim 1, wherein a portion of the first pattern which is not overlapped with the antenna pattern further comprises fourth conductive lines which extend in the first direction to cross the third conductive lines and to define second openings corresponding to the light-emitting regions.

9. The electronic device of claim 1, wherein a portion of the antenna pattern which is not overlapped with the first pattern further comprises second antenna conductive lines which extend in the second direction to cross the first conductive lines and to define third openings corresponding to the light-emitting regions.

10. The electronic device of claim 1, further comprising:
    an antenna pad disposed in the peripheral region; and
    an antenna line connecting the antenna pattern and the antenna pad.

11. An electronic device, comprising:
    a display layer comprising an active region which includes light-emitting regions and a non-light-emitting region disposed adjacent to the light-emitting regions, and a peripheral region which is disposed adjacent to the active region;

an antenna pattern comprising first antenna conductive lines which extend in a first direction and second antenna lines which extend in a second direction crossing the first direction to cross the first antenna conductive lines, the first antenna conductive lines and the second antenna conductive lines defining first openings corresponding to the light-emitting regions; and a sensor layer comprising a first pattern at least a portion of which is overlapped with the antenna pattern and a second pattern which is not overlapped with the antenna pattern, wherein each of the first pattern and the second pattern comprises first sensing conductive lines each of which extends in the first direction and second sensing conductive lines each of which extends in the second direction to cross the first sensing conductive lines, the first sensing conductive lines and the second sensing conductive lines defining second openings corresponding to the light-emitting regions, wherein intersections of the first sensing conductive lines and the second sensing conductive lines of the first pattern are disposed in the first openings when viewed in a plan view, and wherein intersections of the first antenna lines and the second antenna lines are disposed in the second openings when viewed in a plan view.

12. The electronic device of claim 11, wherein each of the first sensing conductive lines, the second sensing conductive lines, the first antenna conductive lines, and the second antenna conductive lines is overlapped with the non-light-emitting region.

13. The electronic device of claim 11, wherein each of the first pattern and the second pattern is provided in plural, wherein the sensor layer comprises a first sensing insulating layer disposed on the display panel, a second sensing insulating layer disposed on the first sensing insulating layer including first contact holes, a third sensing insulating layer disposed on the second sensing insulating layer, and at least one conductive pattern disposed between the first sensing insulating layer and the second sensing insulating layer and overlapped with the contact holes, wherein the first patterns and the second patterns are disposed on the second sensing insulating layer, and wherein one of the first patterns and the second patterns is connected to the conductive pattern through the contact holes.

14. The electronic device of claim 13, further comprising an antenna insulating layer which is overlapped with at least three first patterns.

15. The electronic device of claim 14, wherein the antenna insulating layer is disposed on the third sensing insulating layer.

16. The electronic device of claim 14, wherein the antenna insulating layer is disposed between the second sensing insulating layer and the third sensing insulating layer, and the antenna pattern is covered with the third sensing insulating layer.

17. The electronic device of claim 13, wherein the first pattern and the antenna pattern are disposed on the second sensing insulating layer and are covered with the third sensing insulating layer, wherein the first sensing conductive lines and the second sensing conductive lines of the first pattern are disconnected at intersections with the first antenna conductive lines and the second antenna conductive lines when viewed in a plan view, wherein the first pattern further comprises first bridge patterns overlapped with the disconnected portions of the first sensing conductive lines and the second sensing conductive lines, and wherein the first bridge patterns connect the first sensing conductive lines and the second sensing conductive lines through second contact holes defined in the second sensing insulating layer.

18. The electronic device of claim 13, wherein the first pattern and the antenna pattern are disposed on the second sensing insulating layer and are covered with the third sensing insulating layer, wherein the first antenna conductive lines and the second antenna conductive lines are disconnected at intersections with the first sensing conductive lines and the second sensing conductive lines when viewed in a plan view, wherein the antenna pattern further comprises second bridge patterns overlapped with the disconnected portions of the first antenna conductive lines and the second antenna conductive lines, and wherein the second bridge patterns connect the disconnected portions of the first antenna conductive lines and the second antenna conductive lines through third contact holes which are defined in the second sensing insulating layer.

19. The electronic device of claim 11, wherein an area of the second openings in a portion of the first pattern which is overlapped with the antenna pattern is larger than an area of the second openings in a portion of the first pattern which is not overlapped with the antenna pattern.

20. The electronic device of claim 11, further comprising:

an antenna pad disposed in the peripheral region; and an antenna line connecting the antenna pattern and the antenna pad.

* * * * *